United States Patent
Sons et al.

(10) Patent No.: US 9,396,293 B2
(45) Date of Patent: Jul. 19, 2016

(54) ADJUSTMENT SIMULATION METHOD FOR ENERGY CONSUMPTION

(71) Applicant: Cenergistic Inc., Dallas, TX (US)

(72) Inventors: Bryan Sons, Dallas, TX (US); Jack Bullock, Dallas, TX (US)

(73) Assignee: CENERGISTIC LLC, Dallas, TX (US)

(*) Notice: Subject to any disclaimer, the term of this patent is extended or adjusted under 35 U.S.C. 154(b) by 880 days.

(21) Appl. No.: 13/670,287

(22) Filed: Nov. 6, 2012

(65) Prior Publication Data

US 2014/0129197 A1    May 8, 2014

(51) Int. Cl.
  *G06F 17/50*    (2006.01)
  *G06Q 30/02*    (2012.01)

(52) U.S. Cl.
  CPC ........ *G06F 17/5004* (2013.01); *G06F 17/5036* (2013.01); *G06Q 30/0201* (2013.01); *G06Q 30/0205* (2013.01); *G06Q 30/0206* (2013.01); *Y02T 10/82* (2013.01)

(58) Field of Classification Search
  CPC ............ G06F 17/5004; G06F 17/5036; G06Q 30/0206; G06Q 30/0201; G06Q 30/0205; Y02T 10/82
  See application file for complete search history.

(56) References Cited

U.S. PATENT DOCUMENTS

| | | | |
|---|---|---|---|
| 6,134,511 A | 10/2000 | Subbarao | |
| 6,968,295 B1 | 11/2005 | Carr | |
| 7,216,021 B2 | 5/2007 | Matsubara et al. | |
| 7,392,661 B2 | 7/2008 | Alles | |
| 7,664,574 B2 | 2/2010 | Imhof et al. | |
| 7,881,889 B2 | 2/2011 | Barclay et al. | |
| 2005/0278291 A1* | 12/2005 | Barrette et al. | 707/1 |
| 2006/0241905 A1* | 10/2006 | McCalla | 702/182 |

(Continued)

FOREIGN PATENT DOCUMENTS

| | | |
|---|---|---|
| GB | 2408592 A | 6/2005 |
| GB | 2448896 | 11/2008 |

(Continued)

OTHER PUBLICATIONS

Moncef Krarti, "Energy audit of building systems," second edition, 2001, CRC Press, p. 16-14.*

(Continued)

*Primary Examiner* — Kamini S Shah
*Assistant Examiner* — Russ Guill
(74) *Attorney, Agent, or Firm* — Schultz & Associates, P.C.

(57) ABSTRACT

A method for analyzing energy savings for a building is provided. The method includes receiving a historical energy usage and a weather data for a building, a set of operations parameters describing building operations and a set of building system parameters describing building systems. A baseline configuration is submitted to a first energy consumption simulation to determine a baseline energy usage profile. A calibrated configuration is determined from the baseline configuration and the historical energy usage. The calibrated configuration is submitted to a second energy consumption simulation to determine a calibrated energy usage profile. A hypothetical configuration is determined from the calibrated configuration and a set of energy improvement measures. The hypothetical configuration is submitted to a third energy consumption simulation to determine a hypothetical energy usage profile and report. The set of energy improvement measures are approved and implemented based on the hypothetical energy usage profile.

41 Claims, 26 Drawing Sheets

(56) References Cited

U.S. PATENT DOCUMENTS

| | | | |
|---|---|---|---|
| 2007/0100479 A1* | 5/2007 | Ahmed | 700/47 |
| 2010/0114383 A1 | 5/2010 | Rosca et al. | |
| 2011/0077779 A1 | 3/2011 | Fuller et al. | |
| 2011/0093424 A1 | 4/2011 | Zimmermann et al. | |
| 2011/0153103 A1 | 6/2011 | Brown et al. | |
| 2011/0246381 A1* | 10/2011 | Fitch | G06Q 10/04 705/313 |
| 2011/0251933 A1 | 10/2011 | Egnor et al. | |
| 2012/0084063 A1 | 4/2012 | Drees et al. | |
| 2012/0150509 A1 | 6/2012 | Shiel | |

FOREIGN PATENT DOCUMENTS

| | | |
|---|---|---|
| WO | 2011045370 A1 | 4/2011 |
| WO | 2011072332 A1 | 6/2011 |
| WO | 2011106916 A1 | 9/2011 |
| WO | 2012037241 A1 | 3/2012 |
| WO | 2012071485 A2 | 5/2012 |

OTHER PUBLICATIONS

J.A. Clarke, "Energy simulation in building design," 2001, Butterworth-Heinemann, p. 295.*

Mohammad Saas Al-Homoud, "Computer-aided building energy analysis technique," 2001, Building and Environment, vol. 36, pp. 421-433.*

Yiqun Pan et al., "Calibrated building energy simulation and its application in a high-rise commercial building in Shanghai," 2007, Energy and Buildings, vol. 39, pp. 651-657.*

"Building Energy Use and Cost Analysis Program vol. 1: Basics," 2004, Lawrence Berkeley National Laboratory, 234 pages.*

"Building Energy Use and Cost Analysis Program vol. 2: Dictionary," 2009, Lawrence Berkeley National Laboratory, 519 pages.*

D. Kolokatsa et al., "Decision support methodologies on the energy efficiency and energy management in buildings," 2009, Advances in Building Energy Research, vol. 3, pp. 121-146.*

Nexant, "M&V Guidelines: Measurement and Verification for Federal Energy Projects Version 3," Apr. 2008, 306 pages.*

"ASHRAE Guideline Measurement of Energy and Demand Savings," 2002, ASHRAE Guideline 14, American Society of Heating, refrigerating and Air-Conditioning Engineers, 170 pages.*

Stanton W. Hadley et al., "Modeling U.S. Energy Use Changes with Global Climate Change," 2006, Oak Ridge National Laboratory, 60 pages.*

* cited by examiner

FIG. 3

BASELINE HISTORICAL CONSUMPTION CALIBRATION DATA

- Enter Electrical Average Unit Cost (Bill 9): 0.1049 — 301
- Select the Heating Utility Units: Therm — 302
- Enter Heating Utility Average Unit Cost (Bill 9): 1.1283 — 303
- Enter the electricity cost per square foot (Bill 11): 0.71 — 304
- Enter the heating utility cost per square foot (Bill 11): 0.438 — 305

Monthly Electrical Utility Consumption — 306

Enter historical monthly electrical consumption (Bill 13):

| Jan | Feb | Mar | Apr | May | Jun |
|---|---|---|---|---|---|
| 36960 | 42240 | 33720 | 31200 | 29280 | 21240 |

| Jul | Aug | Sept | Oct | Nov | Dec |
|---|---|---|---|---|---|
| 10320 | 16800 | 30120 | 30480 | 36120 | 32400 |

Monthly Heating Utility Consumption — 307

Enter historical monthly heating consumption (Bill 13):

| Jan | Feb | Mar | Apr | May | Jun |
|---|---|---|---|---|---|
| 2687 | 3202 | 2316 | 2287 | 1584 | 792 |

| Jul | Aug | Sept | Oct | Nov | Dec |
|---|---|---|---|---|---|
| 184 | 191 | 349 | 1649 | 2707 | 2971 |

Save Simulation Calibration Data — 308

Return to Main

All ECAP reports that you use to get data for this form should be setup for the same period of time as the base simulation

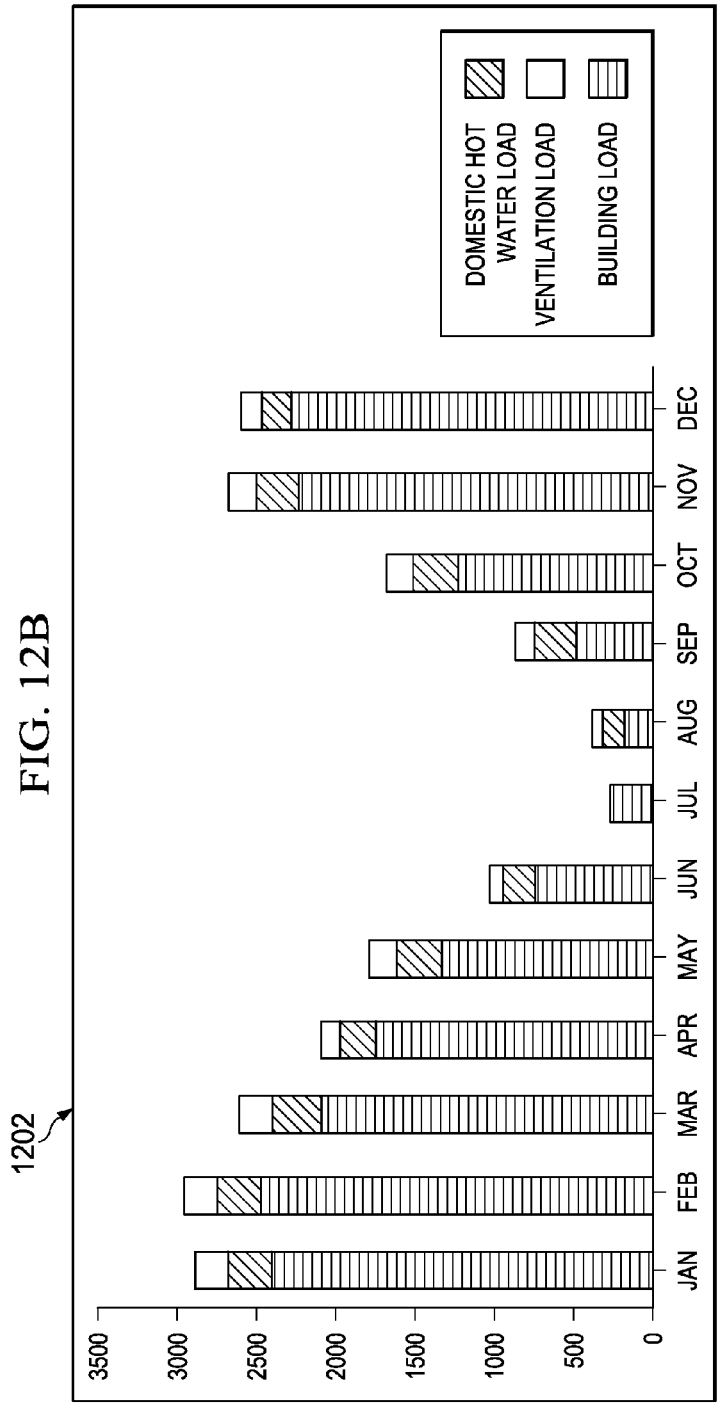

FIG. 13A

Clear Summary Report

| Energy Model Input Information | Base Simulation Description | | | | | Modified Simulation Description | |
|---|---|---|---|---|---|---|---|
| Client Name | Calibrated Model | | | | | Modified Model | |
| Weather: | Kent Washington June 2010 | | | | | | |
| Base Simulation Building Square Footage: | 59,464 | | | | | | |
| Modified Simulation Building Square Footage: | | | | | | 59,464 | |

Electrical Simulation Comparison Information (1301)

| Month | January | February | March | April | May | June | July |
|---|---|---|---|---|---|---|---|
| Days of the Month | 31 | 28 | 31 | 30 | 31 | 30 | 31 |
| Calibrated Model (1310) | 28451 | 28352 | 32039 | 26086 | 31456 | 24734 | 11017 |
| Modified Model (1311) | 23864 | 23763 | 26977 | 22137 | 26571 | 21116 | 9911 |
| Simulation Net Effect Consumption | 4587 | 4589 | 5062 | 3949 | 4885 | 3618 | 1106 |
| ECAP Cooling Day Adjustment (1312) | 148.0 | 163.9 | 163.3 | 131.6 | 157.6 | 120.6 | 35.7 |
| Cooling Units: | KWH | | | | | | |

| | | Electrical Consumption Simulation Validation (1313) | Simulated Consumption (1314a) | Actual Consumption (1315) |
|---|---|---|---|---|
| Simulated Consumption Adjustment | 48561 | Calibrated Model (1304) | 322,898 | 350,880 |
| Electrical Rate | $ 0.10 | Modified Model | 274,337 (1314b) | |
| Simulation Adjustment Estimated Value | $ 5,094 | | | |

| | August | September | October | November | December |
|---|---|---|---|---|---|
| | 31 | 30 | 31 | 30 | 31 |
| | 26429 | 31981 | 31044 | 28337 | 22972 |
| | 23290 | 27159 | 26162 | 23854 | 19553 |
| | 3139 | 4822 | 4882 | 4483 | 3439 |
| | 101.3 | 160.7 | 157.5 | 149.4 | 110.9 |
| | | | | Note: Negative numbers are a positive ECAP adjustment | |
| Cost | S/Sqr Ft | | ECAP S/Sqr Ft | Deviation | Validation |
| $ 33,872.00 | $ 0.57 | | $ 0.71 | 8.0% | PASS |
| $ 28,777.95 | $ 0.48 | | Bill 11 Report - Electricity Only for 12 Months | | |

1301, 1310, 1311, 1312, 1319, 1318, 1317a, 1317b, 1316a, 1316b, 1304

FROM FIG. 13A

Figure 13C:
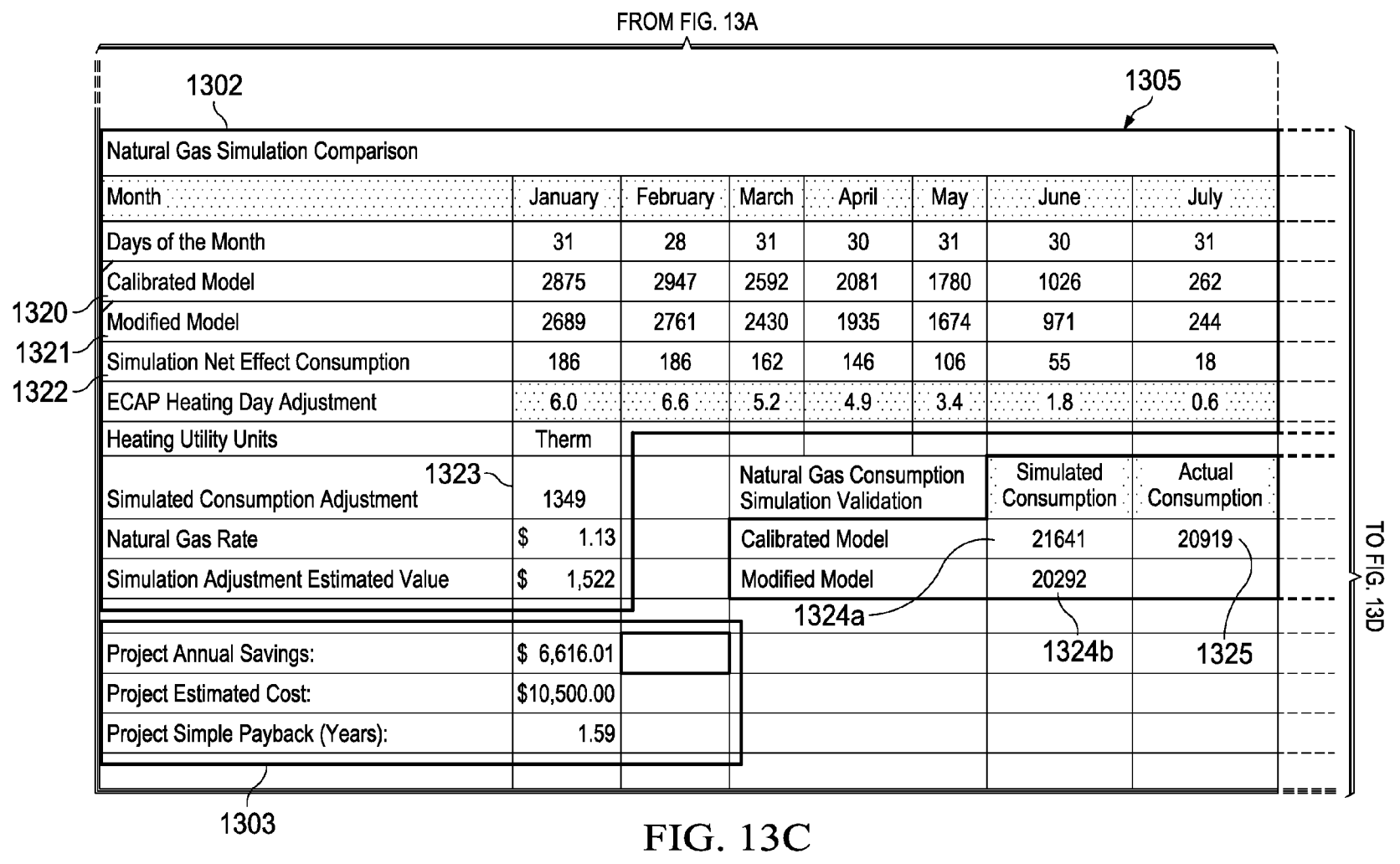

FROM FIG. 13A / TO FIG. 13D

Natural Gas Simulation Comparison — 1302, 1305

| Month | January | February | March | April | May | June | July |
|---|---|---|---|---|---|---|---|
| Days of the Month | 31 | 28 | 31 | 30 | 31 | 30 | 31 |
| Calibrated Model | 2875 | 2947 | 2592 | 2081 | 1780 | 1026 | 262 |
| Modified Model | 2689 | 2761 | 2430 | 1935 | 1674 | 971 | 244 |
| Simulation Net Effect Consumption | 186 | 186 | 162 | 146 | 106 | 55 | 18 |
| ECAP Heating Day Adjustment | 6.0 | 6.6 | 5.2 | 4.9 | 3.4 | 1.8 | 0.6 |
| Heating Utility Units | Therm | | | | | | |
| Simulated Consumption Adjustment | 1349 | | | Natural Gas Consumption Simulation Validation | | Simulated Consumption | Actual Consumption |
| Natural Gas Rate | $ 1.13 | | | Calibrated Model | | 21641 | 20919 |
| Simulation Adjustment Estimated Value | $ 1,522 | | | Modified Model | | 20292 | |

1320 — Simulated Consumption Adjustment (1323)
1321 — Natural Gas Rate
1322 — Simulation Adjustment Estimated Value
1324a — Calibrated Model; 1324b; 1325

| | |
|---|---|
| Project Annual Savings: | $ 6,616.01 |
| Project Estimated Cost: | $10,500.00 |
| Project Simple Payback (Years): | 1.59 |

| | August | September | October | November | December |
|---|---|---|---|---|---|
| | 31 | 30 | 31 | 30 | 31 |
| | 296 | 860 | 1672 | 2672 | 2580 |
| | 280 | 821 | 1574 | 2502 | 2412 |
| | 26 | 39 | 98 | 169 | 168 |
| | 0.5 | 1.3 | 3.2 | 5.6 | 5.4 |

Note: Negative numbers are a positive ECAP adjustment

| | Cost | $/Sqr Ft | ECAP $/Sqr Ft | Deviation | Validation |
|---|---|---|---|---|---|
| 1326a | $ 24,417.77 | $ 0.41 | 0.44 | -3.5% | PASS |
| 1326b | $ 22,895.80 | $ 0.39 | | | |

1327a / 1327b

Bill 11 Report - Natural Gas Only for 12 Months — 1328

1329

1305

FROM FIG. 13C

ADJUSTMENT SIMULATION METHOD FOR ENERGY CONSUMPTION

FIELD OF THE INVENTION

The present invention relates to assessment, calibration and modification of the energy usage profile for a building to impact energy consumption by the building and occupants.

BACKGROUND OF THE INVENTION

Control of energy costs is a high priority with businesses and governments. The assessment of a baseline energy usage profile for a building as related to mechanical systems consumption due to heating and cooling loads is fairly well understood according to building science principles. The baseline energy costs may be inaccurate due to unverified and unreported occupant and systems behavior which is not directly discoverable. Furthermore, there are a large number of variables involved in the modeling of energy consumption such as occupant behavioral factors and unknown equipment efficiencies that feed inaccuracy of the results and lead to poor decision making. Calibration of the baseline energy usage profile to historical energy usage is possible; however, calibration methods are not an exact science due to the large number of variables involved.

U.S. Pat. No. 6,134,511 to Subbarao discloses a method and apparatus for improving building energy simulations where the calibration of building energy simulations with performance data is accomplished by introducing corrective heat flows. Subbarao utilizes the energy simulator DOE-2 which requires complex evaluation of a large number of inputs and outputs and is not suitable for providing rapid feedback.

U.S. Pat. No. 6,968,295 to Carr discloses a method of and system for auditing the energy-usage by a facility, where the facility includes an energy-using system having an operational parameter with a value. Carr does not disclose a calibration process for energy-usage.

U.S. Pat. No. 7,881,889 to Barclay et al. discloses a computer implemented method to facilitate determining energy cost savings in an energy consuming facility using an artificial intelligence model. The drawback of Barclay et al. is that the disclosed method requires a wide variety of training data sets to predict energy savings accurately.

U.S. Patent Application No. 2011/0153103 to Brown et al. discloses a system and method for predictive modeling of building energy consumption providing predicted building energy load values determined by smoothing of historical building energy load values for a building. Brown et al. requires complex optimization training to optimize prediction of building energy load values by "cross-validation error minimization."

U.S. Patent Application No. 2011/0246381 to Fitch et al. discloses a method of modeling energy usage and cost impacts for a building and comparing a theoretical data set to an actual building performance to determine a margin of error. Fitch et al. requires complex evaluation of a large number of inputs and outputs.

U.S. Patent Application No. 2011/0251933 to Egnor et al. discloses a system and method for modeling a building's energy usage over time based on historic data. Egnor et al. uses a regression analysis which requires extensive data sets for predicting the energy usage of the building.

U.S. Patent Application No. 2012/0084063 to Drees et al. discloses a system for detecting changes in energy usage in a building. A baseline energy usage model is determined from a least squares regression analysis.

BRIEF DESCRIPTION OF THE DRAWINGS

Embodiments of the present invention and its advantages are best understood by referring to the Figures provided.

FIG. 3 is a preferred embodiment of an electronic form to receive historical energy usage data.

FIG. 12B is a preferred embodiment of a graphical report of monthly heating fuel consumption for a building.

FIGS. 13A, 13B, 13C, and 13D are preferred embodiments of a tabular report of electrical and heating fuel energy and monetary savings between a calibrated baseline energy usage profile and a hypothetical energy usage profile.

FIG. 14 is a preferred embodiment of an electronic form configured to receive a set of building envelope parameters for a building.

FIG. 20 is a preferred embodiment of an electronic form configured to receive a set of domestic hot water heating parameters for a building.

FIG. 24 is a preferred embodiment of an electronic form configured to receive general building information, accessory equipment operational data and accessory equipment energy data and to control the operation of an accessory equipment energy simulation.

DETAILED DESCRIPTION

The system and methods described are implemented using digital computer systems. In one aspect of the present disclosure, the systems and methods are implemented on a digital computer having a processor for executing the methods embodied within a set of program instructions. The program instructions are stored in an electronic memory and in digital storage media connected to the digital computer. The digital computer includes a user interface system including a display device and a keying device. The digital storage media can include a compact disc, a hard drive, a flash drive or any other form of portable or non-portable persistent storage suitable for electronically storing program instructions.

In a preferred embodiment, the set of program instructions are implemented within a spreadsheet program on the digital computer, for example, a set of macros and Visual Basic code in a Microsoft Excel™ spreadsheet. However, implementation of the methods of the present disclosure is not intended to be limited to a spreadsheet implementation. Interactive applications through the internet or with distributed computing systems are envisioned.

Figure 1:
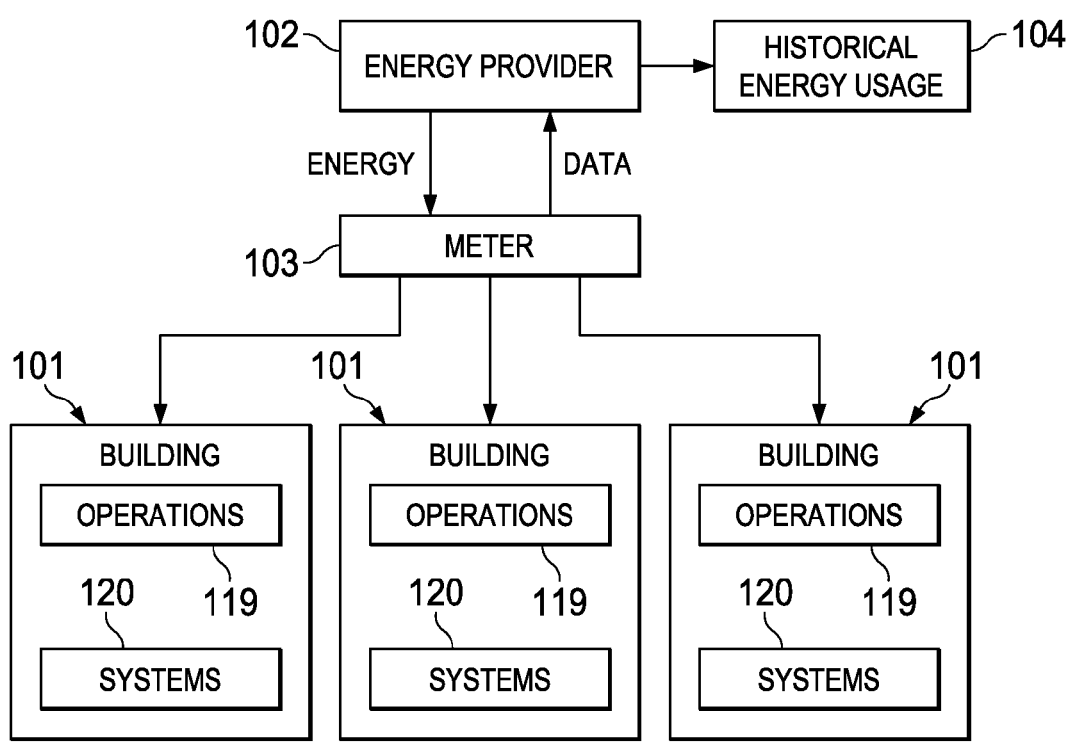
FIG. 1 is a block diagram of a building energy delivery and consumption.

Referring to FIG. 1, buildings 101 are analyzed for energy cost savings according to adjustments to building systems 120. Building systems 120, as they relate to energy consumption, include the thermal envelope of the building, HVAC systems installed in the building, lighting systems used throughout the building and accessory equipment used in the building. Buildings 101 also experience environmental factors such as weather and human interaction primarily through operations. "Operations" include things such as thermostat set points, habits of light usage and accessory equipment usage, hours of operation of the building, etc. "Weather" is defined in the form of data including weather location, a set of monthly cooling degree days, a set of monthly heating degree days, a cooling design temperature, a heating design temperature and a peak humidity ratio.

Buildings 101 receive energy for daily operations from energy provider 102. Energy is consumed by buildings 101 in the form of electrical energy and heating fuel based energy. The amount of energy provided is monitored and recorded by onsite energy meter 103 in a set of time intervals. Historical energy usage 104 is logged by the energy provider to facilitate billing. Historical energy usage data is generally available and usually provided in set time increments.

Figure 2:
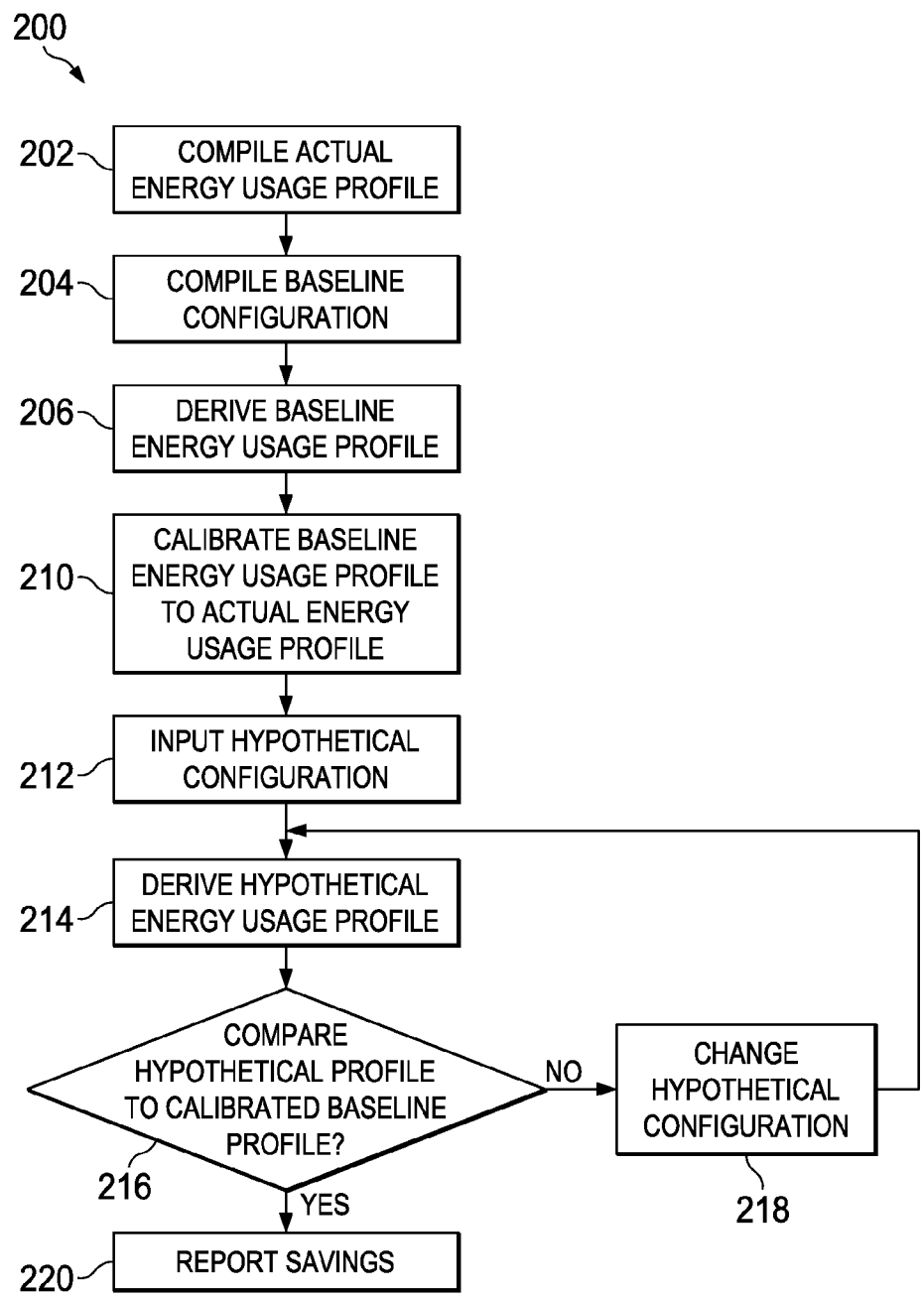
FIG. 2 is a block diagram showing a preferred embodiment of a system to determine, calibrate and modify an energy usage profile for a building to improve energy consumption.

Referring to FIG. 2, adjustment simulator method 200 is shown. At step 202, the historical energy usage is received and converted to an actual energy usage profile comprising an actual monthly electricity consumption and an actual monthly heating fuel consumption for a building for a set of months. At step 204, a baseline configuration is compiled from weather data, a set of occupancy parameters describing building operations 119 and a set of building physical parameters describing building systems 120. The weather data, set of occupancy parameters and set of building physical parameters form a baseline configuration for the building. At step 206, a baseline energy usage profile is derived by performing an energy consumption simulation using the baseline configuration. At step 210, the baseline configuration is calibrated to the actual energy usage profile. Step 210 results in a calibrated baseline configuration and a calibrated baseline energy usage profile. At step 212, a hypothetical configuration 216 is input by applying a set of energy improvement measures to the calibrated baseline configuration. The set of energy improvement measures are intended to improve energy efficiency to meet an energy savings goal. The set of energy improvement measures include modifying R-values of insulation, changing out the mechanical systems for more efficient mechanical systems, modifying heating and cooling setpoints, etc. in the calibrated baseline configuration. At step 214, a hypothetical energy usage profile is derived and reported by performing an energy consumption simulation using the hypothetical configuration. At step 216, the hypothetical energy usage profile is evaluated and compared to the calibrated baseline energy usage profile to determine if the energy savings goal is met.

If the energy savings goal is met, then step 220 is performed to report energy savings results. The energy improvement measures can then be implemented for the building to realize the energy savings. If the energy savings goal is not met, then step 218 is conducted. Step 218, the hypothetical configuration is further modified with additional energy improvement measures. Step 214 is repeated to derive the hypothetical energy usage profile. Step 216 is repeated to evaluate if the energy savings goal is met.

At step 220, the results from the steps 202, 210 and 214 including the calibrated baseline energy usage profile, the hypothetical energy usage profile and the energy savings is reported in graphical and tabular form.

Referring to FIG. 3, electronic form 300 is shown. Electronic form 300 comprises a data entry box 301 for entering an electrical average unit cost (e.g. $/kWh) and a data entry box 304 for entering/displaying the electricity cost per sq. ft. for the building. Electronic form 300 further comprises a data entry box 302 for selecting a heating fuel unit, data entry box 303 for receiving a heating fuel average unit cost (e.g. $/MCF for natural gas units of MCF). A data entry box 305 is included for entering/displaying the heating fuel cost per sq. ft. for the building. Electronic form 300 further comprises a first set of data entry boxes 306 for receiving historical monthly electricity consumptions. Information for first set of data entry boxes can be entered manually from a bill or automatically pre-populated from a spreadsheet. Electronic form 300 also comprises a second set of data entry boxes 307 for receiving historical monthly heating fuel consumptions. Information for the second set of data entry boxes can also be entered manually from a bill or automatically pre-populated from a spreadsheet. The information entered as the historical energy usage data is saved in a persistent and computer readable format by selecting "form" button 308.

Figure 4:
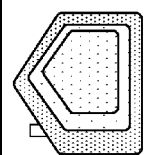
FIG. 4 is a preferred embodiment of an electronic form to receive a building configuration including occupancy information and a set of building physical parameters and to control the operation of an energy simulation, calibration and modification process.

Referring to FIG. 4, electronic form 400 is shown. Basic building data 401 comprises data entry elements for the building name 405, a consultant 406, a client 407 and weather location 408. Upon selection of weather location 408, a set of cooling degree days (CDD) 410 and a set of heating degree days (HDD) 412 for each month of a year time period are populated into electronic form 400.

Set of occupancy data 402 comprises data entry elements for a set of monthly occupied days 414 for each month of the year time period, an average number of occupied hours 415 in an occupied day and an average number of HVAC operation hours 416 in an occupied day.

Set of building physical parameters 403 comprises a set of tabbed entry forms 430 for entering building physical data including a building form, a fan section form, a cooling section form, a heating section form, a lighting selection, plug selection form, a hot water heating form and a peak loads form.

Electronic form 400 also includes data entry boxes for a weather location control 418 a new building type control 419, a calibration data control 420, a load data control 421, an advanced settings control 422, a size equipment control 423, a process simulation control 424 and an exit control 425. Weather location control 418, when selected, initiates a form to create a new weather location with a new set of cooling degree days and heating degree days. New building type control 419, when selected, initiates a form to create a new building type along with a default set of building physical data. Calibration data control 420, when selected, initiates the electronic form 300 of FIG. 3. Load data control 421, when selected, loads persistent data into the electronic form 400, for example, the last building project entered including all of the form data included in the last building project. Enable advanced settings control 422, when selected, renders a set of advanced building physical parameters visible and editable for set of building physical parameters 402, otherwise only a simplified set of building physical parameters are visible and editable. Size equipment control 423, when selected, calculates heating and cooling loads for the building and sizes a set of HVAC equipment for the building. Process simulation control 424, when selected, performs an energy consumption simulation based on the current electronic data stored in electronic form 400 and stores a resulting energy usage profile. Main menu control button 425, when selected, returns program execution to a simplified set of program instructions implementing a main menu form. Exit program control button 426, when selected, stops further execution of the set of program instructions.

In a preferred embodiment, the baseline configuration, calibrated baseline and hypothetical configuration are entered by loading, entering and modifying data in the set of tabbed entry forms 430 of electronic form 400.

Figure 5:
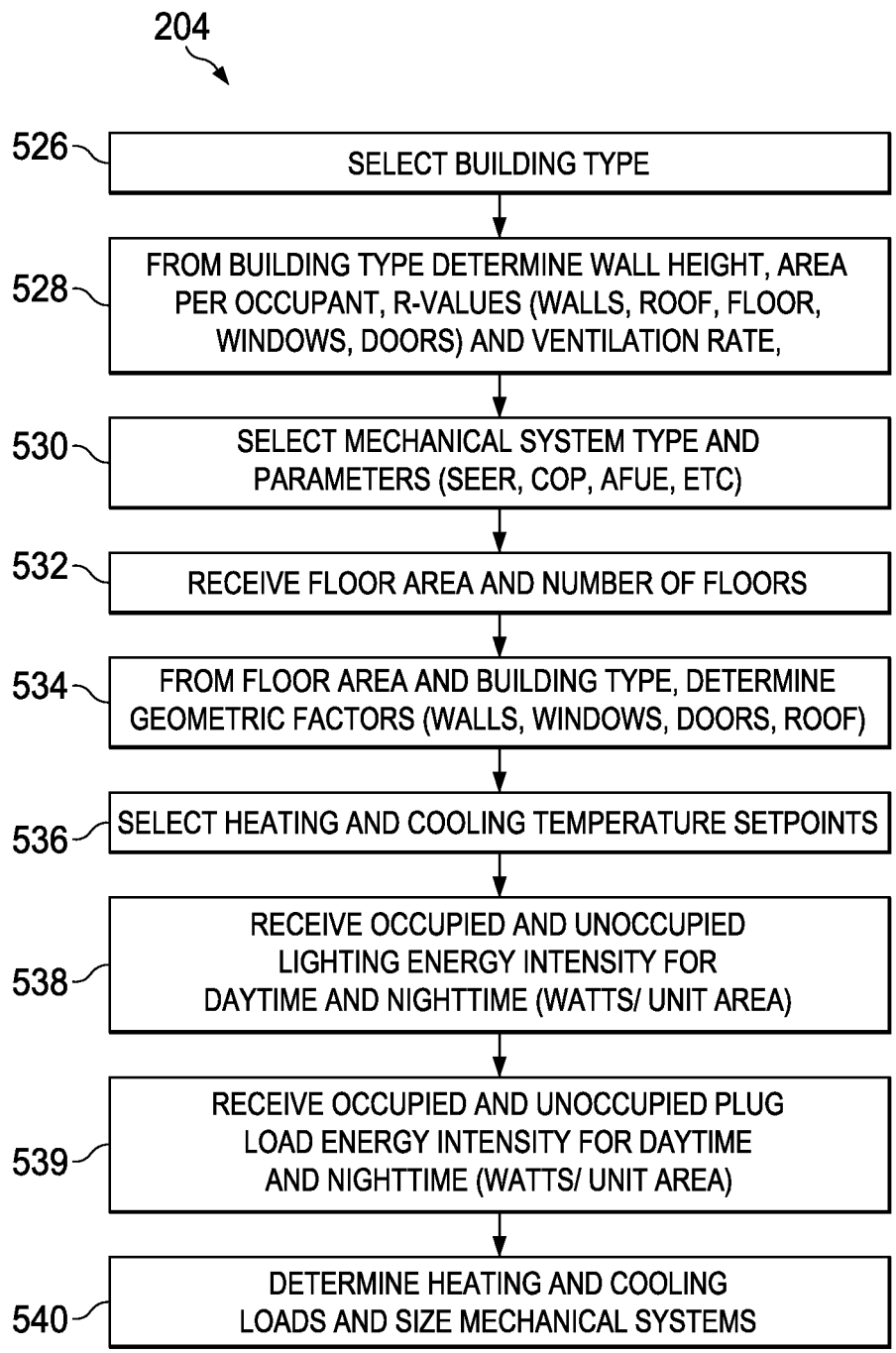
FIG. 5 is a flow chart of a preferred embodiment of a method to construct a building configuration.

Referring to FIG. 5, a detailed method 204 for compiling a baseline configuration is described. At step 526, a building type is selected. In a preferred embodiment, the building type is selected from a set of predefined building types wherein selecting a building type automatically loads an associated set of building physical parameters. The associated set of building physical parameters includes, but it is not limited to, a ventilation CFM per person, a window R value, a door R value, a floor R value, a wall R value, a roof R value, a wall height and an occupied area per person. The R-values are converted into U values for calculating heating and cooling loads, where U=1/R, resulting in $U_{wall}$, $U_{roof}$, $U_{floor}$, $U_{window}$ and $U_{door}$.

For example, a "classroom" building type has an associated set of parameters (presented in British units): ventilation CFM=15, window R value=1.9, door R value=5, floor R value=10, wall R value=3, roof R value=19, wall height=9 ft. and occupied area per person=110 sq. ft. wherein $U_{wall}$=0.33, $U_{roof}$=0.052, $U_{floor}$=0.10, $U_{window}$=0.52, and $U_{door}$=0.20.

In another example, a gymnasium has an associated set of parameters: ventilation CFM=5, window R value=1.9, door R value=5, floor R value=10, wall R value=3, roof R value=19, wall height=25 ft. and occupied area per person=90 sq. ft. wherein $U_{wall}$=0.33, $U_{roof}$=0.052, $U_{floor}$=0.10, $U_{window}$=0.52, and $U_{door}$=0.20.

At step 530, a mechanical system type is selected from a set of predefined mechanical systems. In a preferred embodiment the set of predefined mechanical systems include heat pump systems, DX cooling systems with a gas furnace or electric strip heating, split DX cooling systems with gas furnace or electric strip heating, water cooled or air cooled chilled water cooling systems with gas furnace, hot water heating or steam heating, unit ventilator systems using water cooled or air cooled chilled water with hot water, steam or electric strip heating, air handling systems with various cooling and heating configurations, and variable air volume systems with various cooling and heating configurations.

In a preferred embodiment, selecting a mechanical type automatically loads an associated set of mechanical system parameters.

At step 532, a number of floors and a total floor area is received for the building configuration. At step 534, a set of building factors are determined from the floor area and the building type. The set of building factors include a projected occupancy, a total occupant required ventilation rate, a total building volume and a set of geometric factors including a wall factor, a roof factor, a floor factor, a window factor and a door factor. The projected occupancy is calculated from the floor area and the occupied area per person. Each geometric factor when multiplied by the total floor area, produces "a characteristic area" in the building configuration for the building type. For example, a wall area is calculated for the building equal to the total floor area multiplied by the wall factor for the building type. The window area is calculated for the building equal to the total floor area multiplied by the window factor. In a preferred embodiment, the wall factor, roof factor, floor factor, window factor and door factor are pre-determined for each building type in the set of predefined building types.

At step 536, a cooling temperature set point and a heating temperature set point is received for the building configuration.

At step 538, a set of lighting energy intensities are received for the building configuration. The set of lighting energy intensities describe the energy used for lighting per unit floor area (e.g. Watts/sq.ft.) for different states of occupancy. In the preferred embodiment the set of lighting energy intensities includes a value for an occupied day, a value for an unoccupied day, a value for an occupied night and a value for an unoccupied night.

At step 539, a set of plug load energy intensities are received for the building configuration. The set of plug load energy intensities describe the energy consumed for accessory electrical and electronic equipment per unit floor area (e.g. Watts/sq. ft.) for different states of occupancy. In the preferred embodiment the set of plug load energy intensities includes a value for an "occupied day", a value for an "unoccupied day", a value for an "occupied night" and a value for an "unoccupied night".

At step 540, a heating load and a cooling load is calculated for the building. A heating system size is calculated from the heating load. A cooling system size is calculated from the cooling load. The set of mechanical systems parameters are updated to reflect the calculated heating system size and the calculated cooling system size.

The result of steps 526, 528, 530, 532, 534, 536, 538, 539, and 540 is a baseline configuration which is sufficiently parameterized to perform energy consumption simulations for the building.

Figure 6:
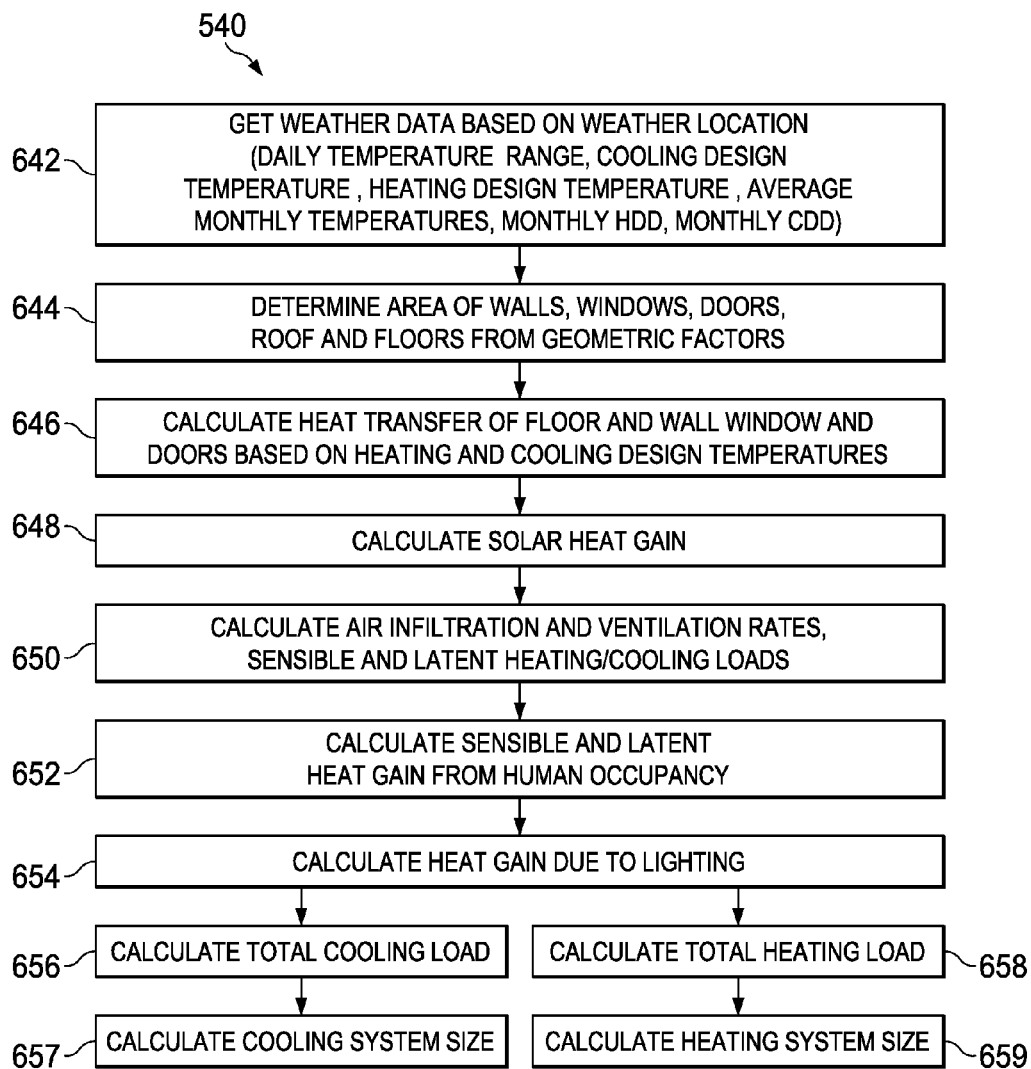
FIG. 6 is a flow chart of a preferred embodiment of a method to determine heating and cooling equipment loads and sizes.

Referring to FIG. 6, details method 540 for determining the heating and cooling loads and sizing mechanical systems is described. At step 642, weather data based on the weather location is loaded. The weather data includes a cooling design temperature, a heating design temperature, a daily temperature range, a peak humidity ratio, a room humidity ratio, a set of average monthly temperatures, a set of monthly cooling degree days and a set of monthly heating degree days.

At step 644, the total areas of the walls, windows, doors, roof and exterior floors, are determined for the baseline configuration from a set of geometric factors.

The set of "geometric factors" includes floor area, wall area, window area, door area and roof area. At step 646, heat transfer is calculated as a cooling load and sensible heating load is calculated for the walls, windows, doors, roof and floors based on the cooling and heating design temperatures, the cooling and heating temperature set points, the cooling degree days and the heating degree days. At step 648, the solar heat gain is calculated for the building.

At step 650, are air infiltration rate and a ventilation rate are determined. A cooling air infiltration load and a heating air infiltration load are calculated from the ventilation rate. A cooling ventilation load and a heating ventilation load are calculated from the ventilation.

At step 652, a sensible ventilation cooling load is calculated from the total occupancy required ventilation rate and cooling temperature set point. A latent ventilation cooling load is calculated from the total occupancy required ventilation rate, the peak humidity ratio and the room humidity ratio. A latent ventilation heating load is calculated from the total occupancy required ventilation rate and the heating temperature set point. A sensible occupant heat gain and a latent occupant heat gain generated by the occupants of the building is calculated from the projected occupancy.

At step 654, a lighting heat gain due to lighting is calculated from the lighting energy intensity and the floor area.

Then, at step 656, a total sensible cooling load is calculated as the sum of the sensible cooling loads for the walls, windows, doors, roof and floors along with the solar heat gain, the lighting heat gain, the sensible occupant heat gain, the sensible infiltration cooling load and the sensible ventilation cooling load. A total latent cooling load is calculated as the sum of the latent occupant heat gain, the latent infiltration cooling load and the latent ventilation cooling load.

At step 657, a cooling system size is determined from the total sensible cooling load, the total latent cooling load and a cooling factor determined from the cooling temperature set point. Further at step 657, a set of fan motor powers are determined based on the cooling system size for supply, return, makeup, condenser and exhaust fans. A set of chiller pump sizes are determined based on the cooling system size including a condenser pump size, a primary pump size and a secondary pump size.

At step 658, a total sensible heating load is calculated as the sum of the sensible heating loads for the walls, windows, doors, roof and floors along with the solar heat gain, the sensible infiltration heating load and the sensible ventilation heating load. A total latent heating load is calculated as the sum of the latent infiltration heating load and the latent ventilation heating load.

At step 659, a heating system size is determined from the total sensible heating load and the total latent heating load, a heating factor determined from the heating temperature set point, and a heating efficiency for the selected heating system. Also at step 659, a set of hot water pump sizes are determined based on the heating system size including a primary heating pump size and a secondary heating pump size.

Figure 7:
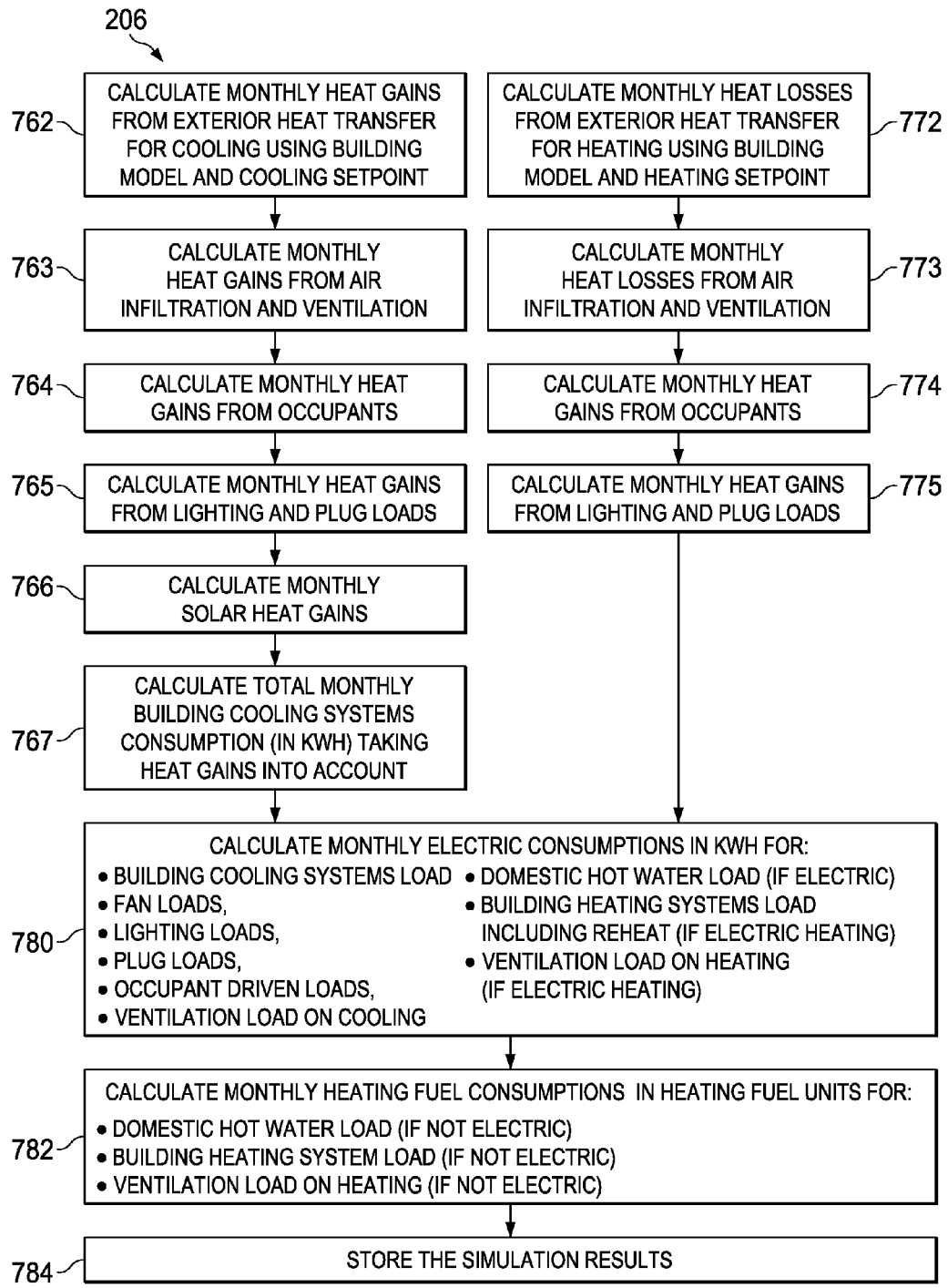
FIG. 7 is a flow chart of a preferred embodiment of a method to simulate energy consumption which determines an energy usage profile for a building including a monthly electrical consumption and a monthly heating fuel consumption.

Referring to FIG. 7, a baseline energy usage profile is determined. An energy consumption simulation is performed for the building according to the building configuration, the calculated cooling and heating loads and the calculated cooling and heating system sizes. In a preferred embodiment, the energy consumption simulation is conducted with the CLTD/CLF/SCL method, as known in the art. The energy consumption simulation also uses the set of average monthly temperatures, the daily temperature range, the set of monthly cooling degree days and the set of monthly heating degree days from the weather data.

At step 762, a set of cooling system monthly loads are calculated for each month of the year and summed for the year to arrive at an annual cooling system load. In a preferred embodiment, the monthly cooling load $Q_{Cblg}(m)$ due to heat transfer through the building envelope is calculated for each month m by:

$$Q_{Cblg}(m) = SPFC \cdot UA \cdot CDD(m) \cdot \frac{OccDays(m)}{AllDays(m)} \cdot H,$$

where $$UA = U_{Walls}A_{Walls} + U_{Roof}A_{Roof} + U_{Floor}A_{Floor} + U_{Windows}A_{Windows} + U_{Doors}A_{Doors},$$

and where SPFC is a set point adjustment factor determined from the cooling temperature set point $T_{CSP}$, CDD(m) is the cooling degree days for month m, OccDays(m) is the monthly number of occupied days in the month m, AllDays(m) is the total number of days in the month m and H is the average daily number of HVAC run hours. In a preferred embodiment:

$$SPFC = 1.0 + (74 - T_{CSP}) * 0.02,$$

where $T_{CSP}$ is given in degrees Fahrenheit.

At step 763, a set of monthly heat gains from air infiltration and a set of monthly heat gains from air ventilation are calculated. In a preferred embodiment, the set of monthly heat gains from air infiltration $Q_{Cinfil}(m)$ for cooling is determined by calculating a summer air infiltration flow rate from a pre-determined natural air change rate (ACH) for the building and the total building volume. In a preferred embodiment, a sensible heat gain is determined from the summer air infiltration flow rate according to:

$$Q_{Cinfil}(m) = 1.075 * ACH * \Delta T(m) * AllDays(m) * 24 * 0.71 * CLF(m)$$

where $\Delta T(m)$ is the difference between the average monthly temperature for month m and the cooling temperature set point and CLF(m) is the ratio $$CLF(m) = \frac{CDD(m)}{CDD(m) + HDD(m)},$$

given HDD(m) is the heating degree days for month m.

In a preferred embodiment, the set of monthly heat gains for cooling from air ventilation $Q_{Cvent}(m)$ is determined as:

$$Q_{Cvent}(m) = 1.075 * OACFM * \Delta T_{vc}(m) * AllDays(m) * H * CLF(m),$$

where $\Delta T_{vc}(m)$ is the difference between the average monthly temperature for month m and 55° F. and OACFM is the total occupancy required ventilation rate.

At step 764, a set of monthly heat gains for cooling from occupants is calculated in a according to a preferred embodiment as:

$$Q_{Cpeople}(m) = N_{occ} * qp * \text{AllDays}(m) * H * CLF(m),$$

where $N_{occ}$ is the projected occupancy and the multiplier qp is an estimated heat gain per occupant in BTU/h and can be adjusted by building type. For example, qp=400 is an accepted value for an office building or school building.

At step 765, a set of monthly peak heat gains from lighting systems is calculated according to a preferred embodiment as:

$$Q_{Clight}(m) = 3.41 * L_{od} * F_{use} * F_{SA} * \text{AllDays}(m) * H * CLF(m),$$

where $L_{od}$ is the total lighting wattage (lighting intensity multiplied by floor area) for an occupied day, $F_{use}$ is a lighting usage factor and $F_{SA}$ is an average ballast factor. For example, $F_{use}=0.9$ and $F_{SA}=1.25$ is an accepted value for an office building or school building.

Furthermore at step 765, a set of monthly peak heat gains from plug loads is also calculated according to a preferred embodiment as:

$$Q_{Cplug}(m) = PL_{od} * F_{plug} * \text{AllDays}(m) * H * CLF(m),$$

where $PL_{od}$ is the total plug load wattage (plug load intensity multiplied by floor area) for an occupied day and the multiplier $F_{plug}$ is an estimated plug load factor including a radiation factor and a usage factor. For sensible heat gain, $F_{plug}=1.4$ is an accepted value for an office building or school building. For latent heat gain, $F_{plug}=0.4895$ is an accepted value.

At step 766, a set of monthly solar heat gains for cooling is calculated according to a preferred embodiment as:

$$Q_{Csolar}(m) = SLC * SC * A_{Windows} * \text{AllDays}(m),$$

where SLC and SC are the solar cooling load and the shading coefficient, respectively, determined from the weather location and a glazing type according to standard methods known in the art. See for example, ASHRAE Handbook of Fundamentals 1997, Tables 11, 35B and A28-36, which can incorporated as a set of lookup tables based on the latitude of the weather location.

At step 767 a set of total cooling system loads $Q_{Ctonhr}(m)$ is determined in units of ton hours as the sum of $Q_{Cblg}(m)$, $Q_{Cinfil}(m)$, $Q_{Cvent}(m)$, $Q_{Cpeople}(m)$, $Q_{Clight}(m)$, $Q_{Cplug}(m)$ and $Q_{csolar}(m)$.

At step 772, heating system monthly loads are calculated for each month of the year and summed for the year to arrive at an annual heating system load. The monthly heating load $Q_{Hblg}(m)$ due to heat transfer through the building envelope is calculated for each month m by:

$$Q_{Hblg}(m) = SPFH \cdot UA \cdot HDD(m) \cdot \frac{OccDays(m)}{AllDays(m)} \cdot H,$$

where $$UA = U_{Walls}A_{Walls} + U_{Roof}A_{Roof} + U_{Floor}A_{Floor} + U_{Windows}A_{Windows} + U_{Doors}A_{Doors}.$$

and where SPFH is a set point adjustment factor determined from the heating temperature set point $T_{HSP}$, HDD(m) is the cooling degree days for month m, OccDays(m) is the number of occupied days in the month m, AllDays(m) is the total number of days in the month m and H is the average daily number of HVAC run hours. In a preferred embodiment:

$$SPFH = 1.0 + (T_{HSP} - 68) * 0.02,$$

where $T_{HSP}$ is given in degrees Fahrenheit.

At step 773, a set of monthly heat losses from air infiltration and a set of monthly heat losses from air ventilation are calculated. In a preferred embodiment, the set of monthly heat losses from air infiltration $QH_{infil}(m)$ for heating is determined by calculating a winter air infiltration flow rate from a pre-determined natural air change rate (ACH) for the building and the total building volume. In a preferred embodiment, a sensible heat loss is determined from the winter air infiltration flow rate according to:

$$Q_{Hinfil}(m) = 1.075 * ACH * \Delta T(m) * \text{AllDays}(m) * 24 * 0.71 * HLF(m)$$

where $\Delta T(m)$ is the difference between the average monthly temperature for month m and the heating temperature set point and HLF(m) is the ratio $$HLF(m) = \frac{HDD(m)}{CDD(m) + HDD(m)},$$

given HDD(m) is the heating degree days for month m.

In a preferred embodiment, the set of monthly heat losses from air ventilation $Q_{Hvent}(m)$ is determined from the total occupancy required ventilation rate OACFM as:

$$Q_{Hvent}(m) = 1.075 * OACFM * \Delta T_{vh}(m) * \text{AllDays}(m) * H * HLF(m),$$

where $\Delta T_{vh}(m)$ is the difference between 90° F. and the average monthly temperature for month m.

At step 774, a set of monthly heat gains from occupants is calculated in a according to a preferred embodiment as:

$$Q_{Hpeople}(m) = N_{occ} * qp * \text{AllDays}(m) * H * HLF(m),$$

where $N_{occ}$ is the projected occupancy and the multiplier qp is an estimated heat gain per occupant in BTU/h and can be adjusted by building type. For example, qp=400 is an accepted value for an office building or school building.

At step 775, a set of monthly heat gains from lighting systems is calculated according to a preferred embodiment as:

$$Q_{Hlight}(m) = 3.41 * L_{od} * F_{use} * F_{SA} * \text{AllDays}(m) * H * HLF(m),$$

where $L_{od}$ is the total lighting wattage (lighting intensity multiplied by floor area) for an occupied day, $F_{use}$ is a lighting usage factor and $F_{SA}$ is an average ballast factor. For example, $F_{use}=0.9$ and $F_{SA}=1.25$ is an accepted value for an office building or school building.

Further at step 775, a set of monthly peak heat gains from plug loads is also calculated according to a preferred embodiment as:

$$Q_{Hplug}(m) = 3.41 * PL_{od} * F_{plug} * \text{AllDays}(m) * H * HLF(m),$$

where $PL_{od}$ is the total plug load wattage (plug load intensity multiplied by floor area) for an occupied day and the multiplier $F_{plug}$ is an estimated plug load factor including a radiation factor and a usage factor. For sensible heat gain, $F_{plug}=1.4$ is an accepted value for an office building or school building. For latent heat gain, $F_{plug}=0.4895$ is an accepted value.

At step 780, a set of monthly electrical consumptions is determined including a monthly cooling system electrical consumption, a monthly fan electrical consumption, a monthly lighting electrical consumption, a monthly plug load electrical consumption, a monthly occupant related electrical consumption, a monthly ventilation related electrical consumption, a monthly heating system electrical consumption if the heating fuel is electric and a monthly domestic hot water heating electrical consumption if the hot water is heated electrically. A total monthly electrical consumption is computed as the sum of the set of monthly electrical consumptions for each month in a set of months.

For chilled water cooling systems, ground source and water source heat pumps, a set of cooling pump electrical consumptions in kWh, $Q_{Cpump}(m)$, is computed from the set of cooling pump sizes. For other cooling system types $Q_{Cpump}(m)$ is zero. In a preferred embodiment, the monthly cooling system electrical consumption is determined from:

$$Q_{Cload}(m) = Q_{Cpump}(m) + [Q_{Cblg}(m) + Q_{Cinfil}(m) + Q_{Clight}(m) + Q_{Cplug}(m) + Q_{Csolar}(m)]*CEFF,$$

where $Q_{Cload}(m)$ is in kWh and CEFF is a conversion factor of kW of electricity per ton taking into account a specified efficiency of the cooling systems.

The monthly fan electrical consumption $Q_{fans}(m)$ in kWh is determined based on a set of fan motor powers for supply, return, makeup, condenser and exhaust fans. A first set of fan electrical consumptions is calculated according to:

$$Q_{fanA}(m) = FanA*AllDays(m)*H_{occ},$$

where FanA is the sum of all supply, return and makeup fan motor powers in watts and where $H_{occ}$ is the average number of occupied hours per day. A second set of fan electrical consumptions is calculated according to:

$$Q_{fanB}(m) = FanB*AllDays(m)*Q_{tonhr}(m)/CTONS,$$

where FanB is the total condenser fan motor power in watts and CTONS is the cooling system size in tons. A third set of fan electrical consumptions is calculated according to:

$$Q_{fanC}(m) = FanC*AllDays(m)*H_{ex},$$

where FanC is the total exhaust fan motor power in watts and where $H_{ex}$ is equal to 24 hours if running continuously or equal to $H_{occ}$ if not running during unoccupied hours. A fourth set of fan electrical consumptions is calculated according to:

$$Q_{fanD}(m) = FanD*AllDays(m)*H_{sys},$$

where FanD is the total chiller pump fan power in watts and $H_{sys}$ is equal to $H_{occ}$ for cooling system types that only run during operational hours and equal to 24 hours for cooling system types that require continuous circulation. $Q_{fan}(m)$ is determined as the sum of $Q_{FanA}(m)$, $Q_{FanB}(m)$, $Q_{FanC}(m)$ and $Q_{FanD}(m)$. A fifth set of fan electrical consumptions is calculated according to:

$$Q_{fanE}(m) = FanE*AllDays(m)*H_{sys},$$

where FanE is the total heating system pump fan power in watts and $H_{sys}$ is equal to $H_{HVAC}$ for heating system types that only run during operational hours and equal to 24 hours for heating system types that require continuous circulation. $H_{HVAC}$ is the average HVAC run time per day. $Q_{fans}(m)$ is determined as the sum of $Q_{fanA}(m)$, $Q_{fanB}(m)$, $Q_{fanC}(m)$, $Q_{fanD}(m)$ and $Q_{fanE}(m)$.

The monthly lighting electric consumption is determined from the set of lighting energy intensities for the different states of occupancy, the monthly number of occupied days OccDays(m) and the average number of occupancy hours per day OccHours according to the formula:

$$Q_{lights}(m) = L_{od}*OccDays(m)*OccHours + L_{on}*OccDays(m)*(UnOccHours) + L_{ud}*UnOccDays(m)*12 + L_{un}*UnOccDays(m)*12,$$

where $L_{od}$ is the total lighting wattage (lighting intensity multiplied by floor area) for an occupied day, $L_{on}$ is the total lighting wattage for a night on an occupied day, $L_{ud}$ is the total lighting wattage for an unoccupied day, $L_{un}$ is the total lighting wattage for a night on an unoccupied day and the number of unoccupied days UnOccDays(m)=AllDays(m)−OccDays(m).

The monthly plug load electric consumption is determined from the set of plug load energy intensities for the different states of occupancy, the monthly number of occupied days OccDays(m) and the average number of occupancy hours per day OccHours according to the formula:

$$Q_{plugs}(m) = PL_{od}*OccDays(m)*OccHours + PL_{on}*OccDays(m)*(UnOccHours) + PL_{ud}*UnOccDays(m))*12 + PL_{un}*UnOccDays(m)*12,$$

where $L_{od}$ is the total plug load wattage (plug load intensity multiplied by floor area) for an occupied day, $L_{on}$ is the total plug load wattage for a night on an occupied day, $L_{ud}$ is the total plug load wattage for an unoccupied day, $L_{un}$ is the total plug load wattage for a night on an unoccupied day and the number of unoccupied days UnOccDays(m)=AllDays(m)−OccDays(m).

The monthly occupant related electrical consumption $Q_{occ}(m)$ is determined as $Q_{Cpeople}(m)$ multiplied by CEFF. The monthly ventilation electrical consumption $Q_{vents}(m)$ is determined for cooling as $Q_{Cvent}(m)$ multiplied by CEFF.

If the heating fuel is electric, a monthly heating system electrical consumption is determined from the output of steps 772-775. When variable air volume systems are used, energy is also consumed for reheating which is computed as follows.

$$Q_{reheat1}(m) = (Q_{Cload}(m) - Q_{Cpump}(m))*RHEAT*MF$$

where RHEAT is a predefined constant and MF is an adjustable microclimate factor. In this case, the monthly heating system electrical consumption is determined in kWh as:

$$Q_{Hload}(m) = [(Q_{Hblg}/Heff)/3413 + Q_{reheat1}(m)]*MF$$

where $Q_{Hload}(m)$ is in kWh and HEFF is the efficiency of the heating systems. For example, for electric resistive heating HEFF is equal to 1.0; for heat pumps HEFF is a specified value typically greater than 1.0. Also if the heating fuel is electric, the monthly ventilation electrical consumption is computed together with the cooling system ventilation consumption as:

$$Q_{vents}(m) = (Q_{Cvent}(m)*CEFF + (Q_{Hvent}(m)/HEFF)/3413)*MF.$$

Domestic hot water energy usage is computed in BTU by:

$$Q_{DHW}(m) = V_{person}(d)*Alldays(m)*Occupancy*8.33*(DHTEMP-78)$$

where $V_{person}$ is the average daily volume of hot water used by a person, occupancy is the average occupancy of the building an DHTEMP is the hot water supply temperature setting. If the hot water is heated with electricity then $Q_{DWH}(m)$ is converted to kWh by dividing by 3413 BTU/kWh and reported as the monthly domestic hot water heating electrical consumption in step 780.

At step 782, a set of monthly heating fuel consumptions is determined including a monthly heating system fuel consumption, a monthly ventilation related heating fuel consumption and a monthly domestic hot water heating fuel consumption. A total monthly heating fuel consumptions is computed as the sum of the set of monthly heating fuel consumptions for each month in the set of months.

If the heating fuel is not electric, a monthly heating fuel consumption is determined from the output of steps 772-775. In this case, a monthly heating system load is computed in BTU as:

$$Q_{Hload}(m)=[Q_{Hblg}(m)+Q_{Hinfil}(m)+Q_{reheat2}(m)]*MF/HEFF$$

where the reheating component is computed for variable air volume systems as:

$$Q_{reheat2}(m)=Q_{Cblg}(m)*RHEAT,$$

and where RHEAT is a predefined constant which is equal to zero for systems other than variable air volume systems, HEFF is the heating system efficiency and MF is the adjustable microclimate factor. The monthly heating system fuel consumption is reported in heating fuel units by converting the monthly heating system load from BTU to heating fuel units. For example, 1 therm=100,000 BTU, so in therms, $Q_{HLtherms}(m)=Q_{Hload}(m)/100000$.

A monthly ventilation heating load is computed in BTU as:

$$Q_{vents}(m)=(Q_{Hvent}(m)/HEFF))*MF.$$

The monthly ventilation related heating fuel consumption is reported in heating fuel units by converting the monthly heating system load from BTU to heating fuel units.

If hot water is heated with heating fuel, then the monthly domestic hot water heating fuel consumption is reported in heating fuel units by converting the domestic hot water energy usage $Q_{DHW}(m)$ from BTU to heating fuel units.

At step 784, the set of electrical consumptions and the set of heating fuel consumptions determined in steps 780 and 782 are stored in a persistent memory and reported as the baseline energy usage profile for the building. The baseline energy usage profile includes the total monthly electrical consumption in kWh and the total monthly heating fuel consumption in heating fuel units. In a preferred embodiment, the sets of electrical and heating fuel consumptions are recorded in a spreadsheet which is further saved to a persistent storage device.

Figure 8:
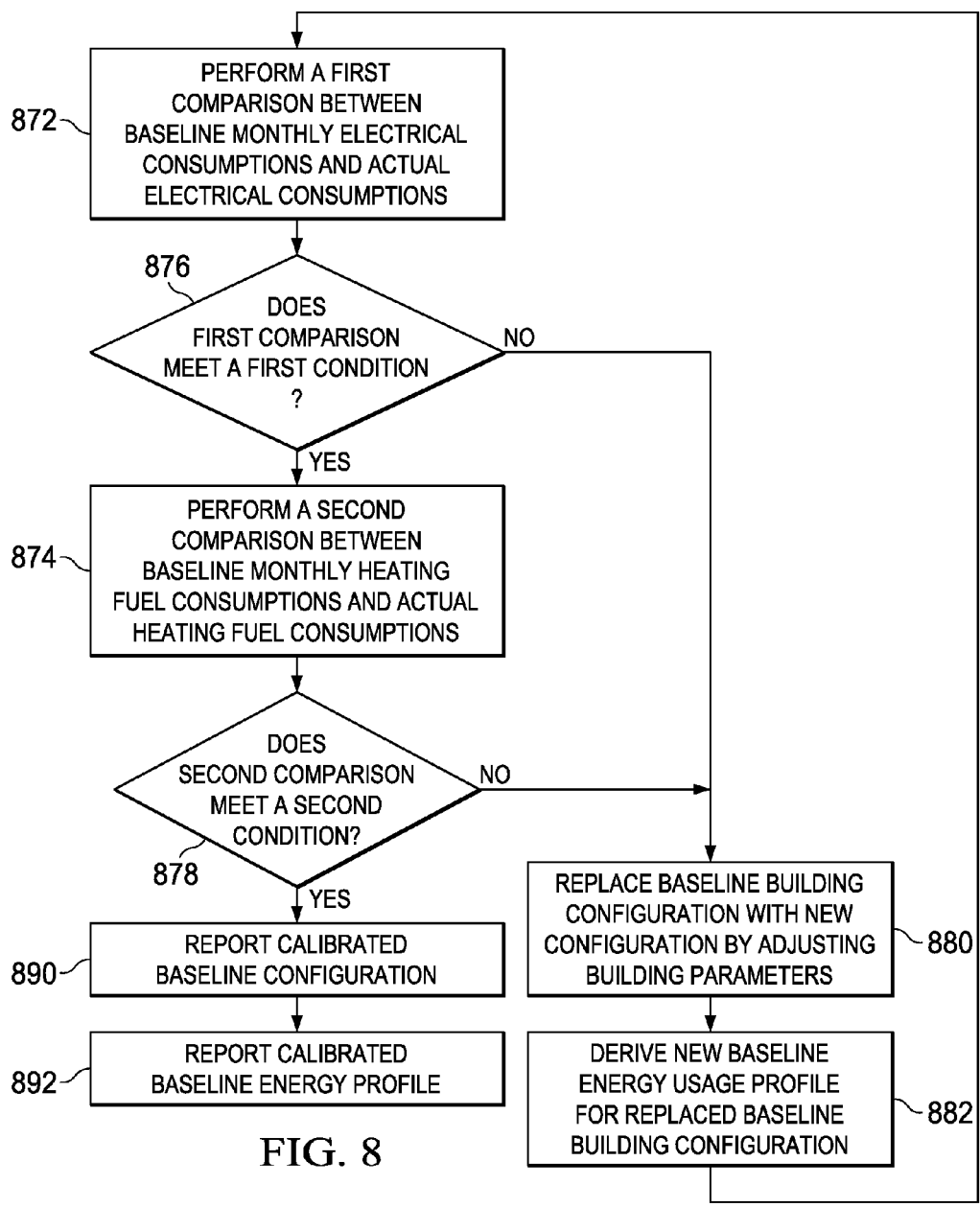
FIG. 8 is a flow chart of a preferred embodiment of a method to calibrate a baseline energy usage profile to an actual energy usage profile for a building.

Referring to FIG. 8, calibration process 210 is performed on a baseline configuration with a baseline energy usage profile. At step 872, a first comparison is performed between the total monthly electrical consumption in the baseline energy usage profile and the actual monthly electrical consumption in the actual energy usage profile for a set of months.

At step 876, the first comparison is checked for meeting a first condition. If the first condition is not met, the method moves to step 880. At step 880, the baseline building configuration is replaced with a new configuration by adjusting the set of building parameters. In a preferred the adjustments to the baseline building configuration are done in electronic form 400 of FIG. 5. At step 882, the baseline energy usage profile is updated by performing an energy simulation on the new configuration. The method then repeats beginning at step 872. If the first condition is met, the method moves to step 874. At step 874, a second comparison is performed between the total monthly heating fuel consumption in the baseline energy usage profile and the actual monthly heating fuel consumption in the actual energy usage profile for a set of months.

At step 878, the second comparison is checked for meeting a second condition. If the second condition is not met, then the method moves to step 880. If the second condition is met, then at step 890, the baseline building configuration is reported as the calibrated baseline configuration. At step 892, the baseline energy usage profile is reported as the calibrated baseline energy usage profile.

Figure 9:
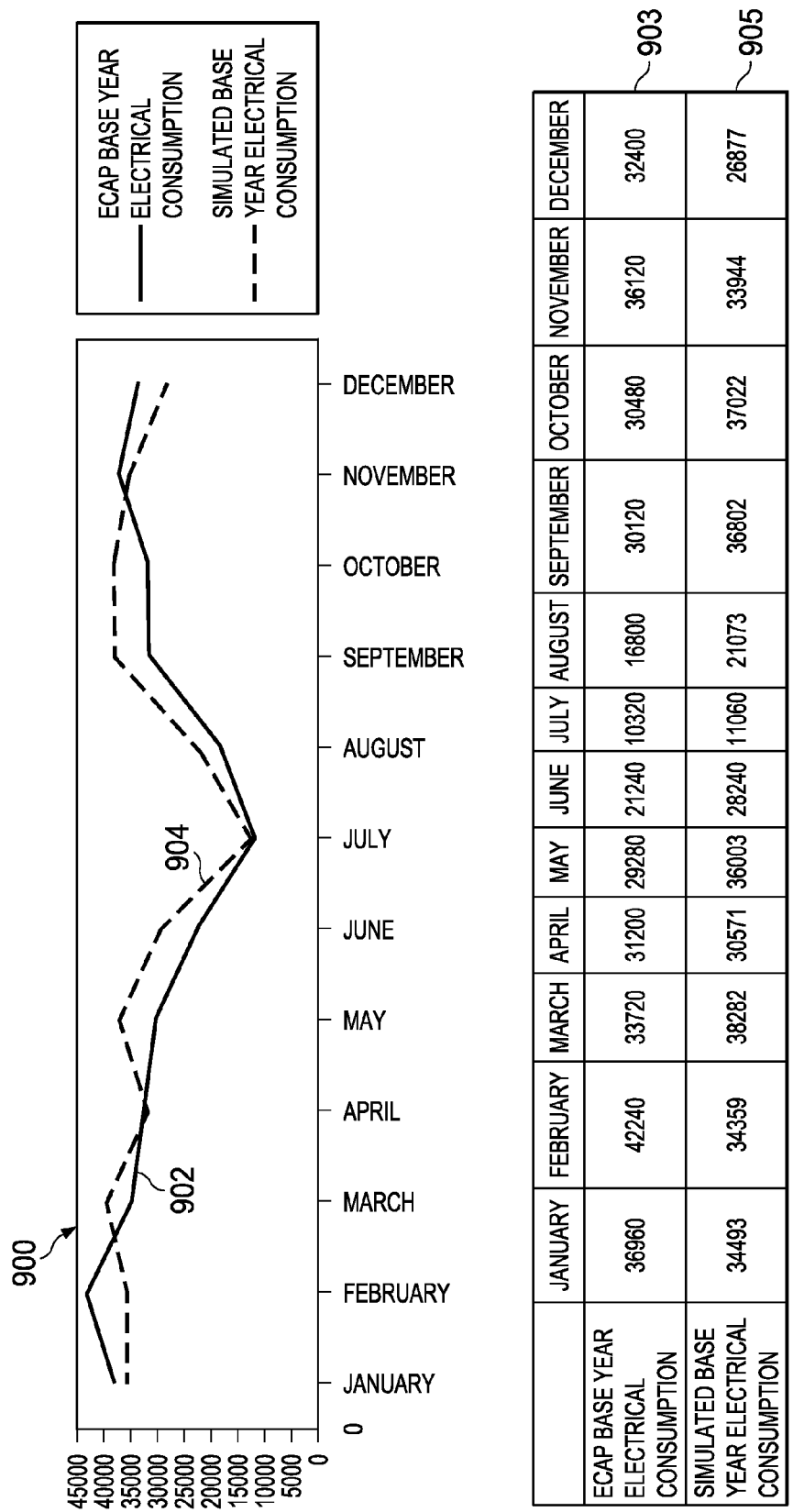
FIG. 9 is a preferred embodiment of a graphical calibration of a baseline energy usage profile and an actual energy usage profile based on historical energy usage.

Referring to FIG. 9, in a preferred embodiment, the actual monthly electrical consumption is compared graphically to the baseline monthly electrical consumption to determine the first condition and the actual monthly heating fuel consumption is compared graphically to the baseline monthly heating fuel consumption to determine the second condition.

Graph 900 includes an example of an actual monthly energy consumption for a building comprising curve 902 and data set 903. Graph 900 further includes an example of a baseline monthly energy consumption for the building comprising curve 904 and data set 905.

In another embodiment, an actual annual electrical consumption is compared numerically to a baseline annual electrical consumption to determine the first condition and an actual annual heating fuel consumption is compared numerically to a baseline annual heating fuel consumption to determine the second condition.

For the first condition, the baseline annual electrical consumption is determined as the sum of all baseline monthly electrical consumptions for all months in a year. A first percentage difference between the baseline annual electrical consumption and the actual annual electrical consumption is calculated and if the absolute value of the first percentage difference is less than a predefined limit, then the first condition is met.

For the second condition, the baseline annual heating fuel consumption is determined as the sum of all baseline monthly heating fuel consumptions for all months in the year. A second percentage difference between the baseline annual electrical consumption and the actual annual electrical consumption is calculated. If the absolute value of the second percentage difference is less than a predefined limit, then the second condition is met.

Generally, curve fitting involves matching curve shape and "closeness" between data points. In alternate embodiments, the first and second conditions are computed with a curve fit and compared to a predefined number. For example, a Pearson correlation coefficient can be computed between two sets of monthly consumptions and compared to a first predefined number. In another example, an RMS correlation coefficient can be computed between two sets of monthly consumptions and compared to a second predefined number. In a combination of matching curve shape and closeness of fit, the average of the difference between the Pearson correlation coefficient and the first predefined number and the difference between the RMS correlation coefficient and the second predefined number is determined.

In the alternate embodiments, the steps of method 210 can be automated by identifying a set of adjustable building parameters and automatically adjusting the set of adjustable building parameters until the first and second conditions are met. The process of automatic adjustment can utilize parametric search methods such as a steepest decent method or a Monte Carlo method. In another embodiment, a combination of automation, visual graphical profiles and computed correlation coefficients may be utilized simultaneously. In this case the automation can be manually interrupted to accept the set of adjustable building parameters into the calibrated baseline configuration, to reconfigure the set of adjustable building parameters and to reconfigure a set of automation parameters.

Figure 22:
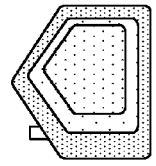
FIG. 22 is a preferred embodiment of an electronic form configured to receive general building information, lighting operational data and lighting fixture data and to control the operation of a lighting systems energy simulation.
Figure 24:
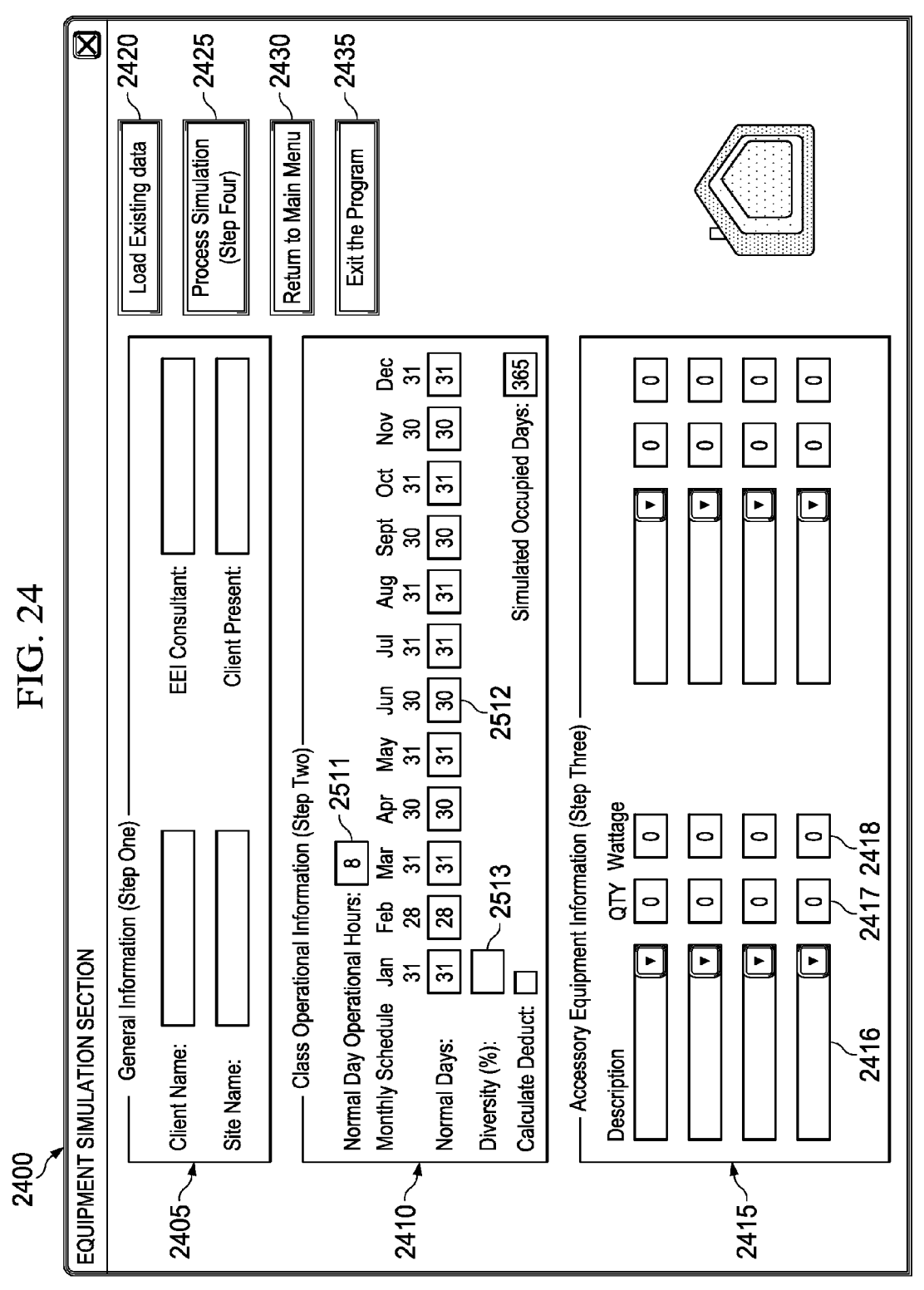

In an alternate embodiment, the lighting systems are separately adjusted and calibrated using electronic form 2200 of FIG. 22 and the plug loads are separately adjusted and calibrated using electronic form 2400 of FIG. 24.

Figure 10:
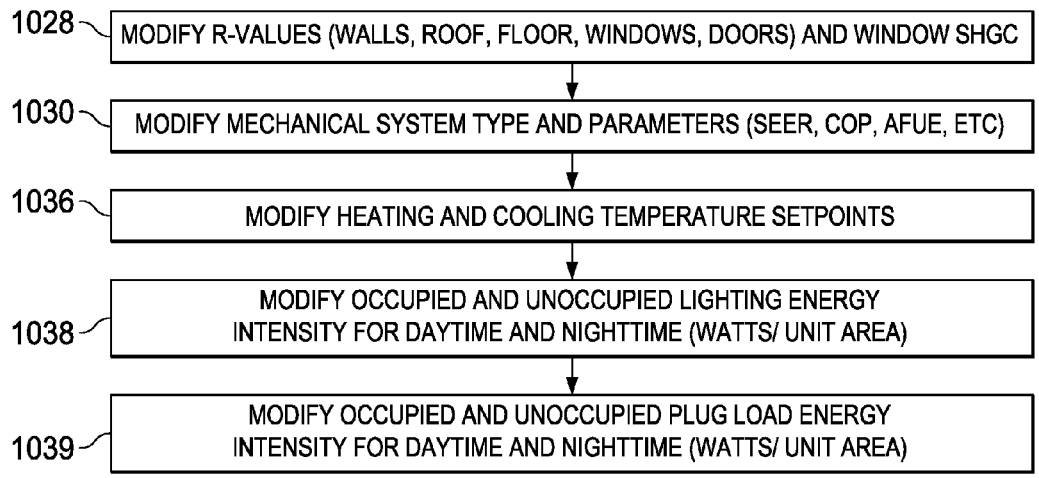
FIG. 10 is a flow chart of a preferred embodiment of a method to modify a building configuration based on a set of energy efficiency improvements.

Referring to FIG. 10, a pre-existing building configuration is modified with energy efficiency improvements resulting in a hypothetical building configuration and hypothetical energy usage profile. Step 212 of method 200 uses the steps of FIG. 10 to modify a calibrated building configuration. Step 218 of method 200 uses the steps of FIG. 10 to modify a hypothetical building configuration. At step 1028, modifications to the building envelope are made to the pre-existing building configuration including insulation R-values of walls, ceilings and floors where insulation is to be added, U-values for replacement doors along with U-values and SHGC values for replacement windows. At step 1030, modifications to the mechanical systems are made to the pre-existing building configuration including cooling systems efficiency (SEER, EER) and heating system efficiency (HSPF, COP, AFUE). In modifying the mechanical systems, the HVAC systems are optionally resized. At step 1036, heating and cooling set points are modified from those in the pre-existing building configuration.

At step 1038, lighting energy intensity is modified based on potential lighting upgrades, for example, replacement of older pin fluorescent light fixtures with more efficient light bulbs and ballasts. At step 1039, plug loads for the calibrated building configuration are modified to remove undesired accessory equipment and make replacements with energy efficient accessory equipment.

In a preferred embodiment, steps 1028, 1030, 1036, 1038 and 1039 are accomplished with the aid of electronic form 400. In an alternate embodiment step 1038 is accomplished by with the aid of electronic form 2200 of FIG. 22 and step 1039 is accomplished with the aid of electronic form 2400 of FIG. 24. FIGS. 22 and 24 and associated methods are described below.

Figure 11:
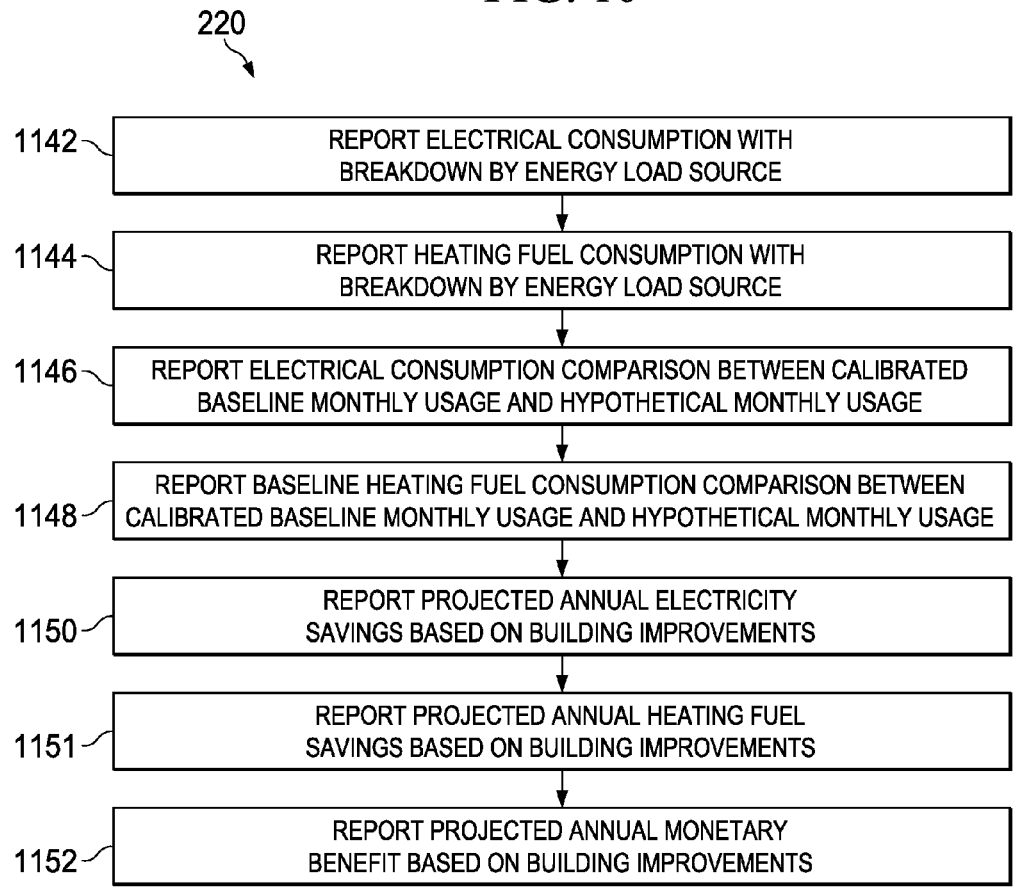
FIG. 11 is a flow chart of a preferred embodiment of a method to report, monthly and annual, electrical and heating fuel consumptions and project a monetary benefit based on a hypothetical energy usage profile.
Figure 12A:
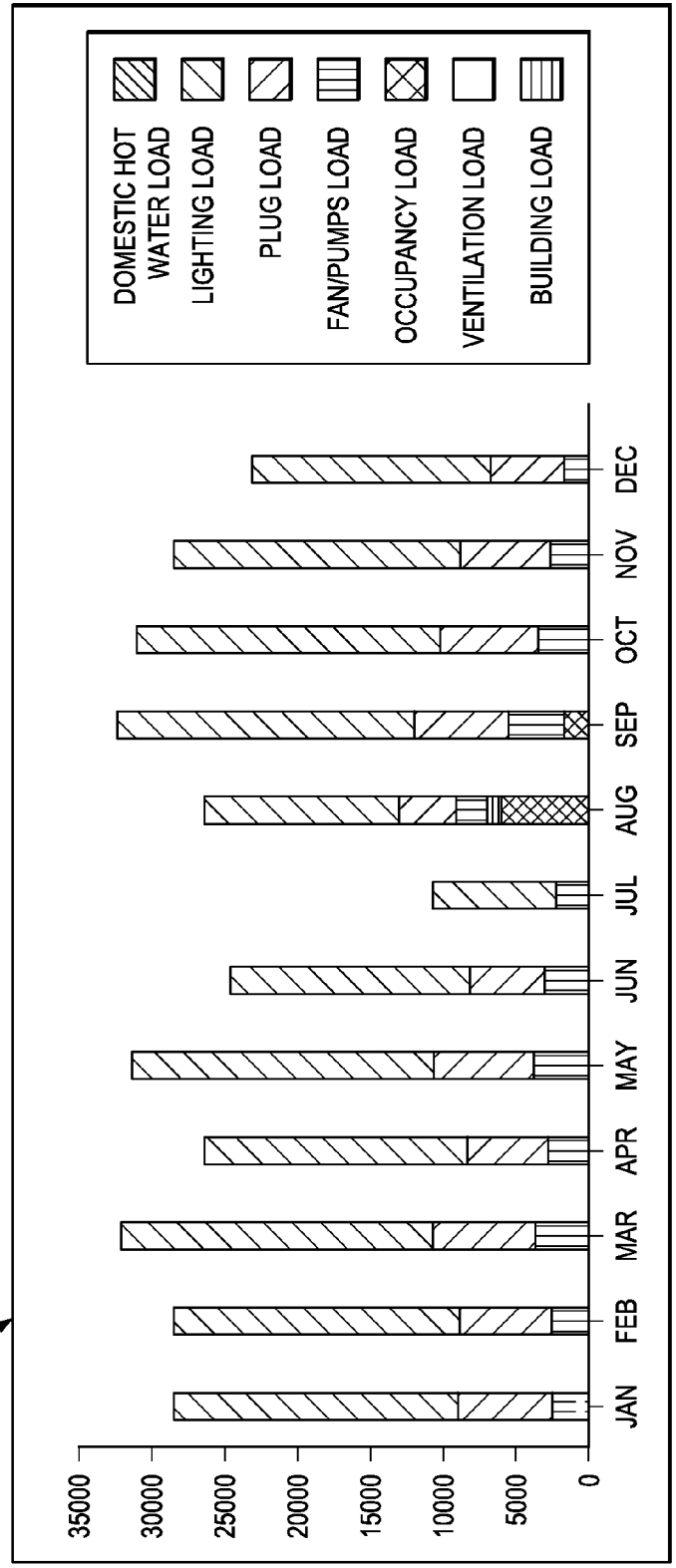
FIG. 12A is a preferred embodiment of a graphical report of a monthly electrical consumption for a building.

Referring to FIG. 11, a detailed method of step 220 report savings is shown. At step 1142, a monthly electricity consumption is broken down by electrical load source and reported. In a preferred embodiment, the electrical load sources are building load, lighting load, plug load, fan load, occupancy driven load, ventilation related load and domestic water heating load if hot water is heated electrically. The building load is $Q_{Cload}(m)$ if heating systems are not electrical and $Q_{Cload}(m)+Q_{Hload}(m)$ if heating systems are electrical. The lighting load is $Q_{lights}(m)$, plug load is $Q_{plugs}(m)$, fan load is $Q_{fans}(m)$, occupancy driven load is $Q_{Cpeople}(m)$, ventilation related load is $Q_{vents}(m)$ and domestic water heating load is $Q_{DWH}(m)$. Also in a preferred embodiment, at step 1142, the monthly electricity consumption is reported in a tabular form in a spreadsheet and in a graphical form. An example of the graphical form of monthly electricity consumption is shown in graph 1201 of FIG. 12A.

At step 1144, a monthly heating fuel consumption is broken down by heating load source and reported. In a preferred embodiment, the heating load sources are building load, ventilation related load and domestic water heating load if not heated electrically. The building load is $Q_{Hload}(m)$ if heating system is not electrical. If heating is electrical $Q_{Hload}(m)$ is reported in the monthly electrical consumption. The ventilation related load is $Q_{Hvent}(m)$ and domestic water heating load is $Q_{DWH}(m)$. Also in a preferred embodiment, at step 1144, the monthly heating fuel consumption is reported in a tabular form in a spreadsheet and in a graphical form. An example of the graphical form of monthly heating fuel consumption is shown in graph 1202 of FIG. 12B.

At step 1146, a selective comparison between two sets of monthly electrical consumptions is performed and reported wherein a first set of monthly electrical consumptions is selected from the baseline energy usage profile, the calibrated baseline energy usage profile and the hypothetical energy usage profile. The second set of monthly electrical consumptions is selected from the actual energy usage profile, the calibrated baseline energy usage profile and the hypothetical energy usage profile. In a preferred embodiment, the selective comparison is performed in a spreadsheet format.

At step 1148, a selective comparison between two sets of monthly heating fuel consumptions is performed and reported wherein a first set of monthly heating fuel consumptions is selected from the baseline energy usage profile, the calibrated baseline energy usage profile and the hypothetical energy usage profile. The second set of monthly heating fuel consumptions is selected from the actual energy usage profile, the calibrated baseline energy usage profile and the hypothetical energy usage profile. In a preferred embodiment, the selective comparison is performed in the spreadsheet format.

At step 1150, a projected annual electricity savings is determined and reported based on a comparison between the calibrated baseline energy usage profile and the hypothetical energy usage profile. At step 1151, a projected annual heating fuel savings is determined and reported based on a comparison between the calibrated baseline energy usage profile and the hypothetical energy usage profile. At step 1152, a projected annual monetary savings is determined and reported based on the comparison between the calibrated baseline energy usage profile and the hypothetical energy usage profile.

Referring to FIGS. 13A, 13B, 13C, and 13D, an example is provided of a preferred embodiment of the spreadsheet format for reporting. The spreadsheet format includes worksheet 1300 comprising table 1301, table 1302, table 1303, table 1304 and table 1305. Table 1301 further comprises a comparison between two sets of monthly electrical consumptions, the first set of monthly electrical consumptions populating row 1310 and the second set of monthly electrical consumptions populating row 1311. Row 1312 contains a calculated difference between row 1311 and row 1310 and represents a set of monthly electrical energy savings which is totaled to an annual electrical energy savings at cell 1313.

Table 1302 further comprises a comparison between two sets of monthly heating fuel consumptions, the first set of monthly heating fuel consumptions populating row 1320 and the second set of monthly electrical consumptions populating row 1321. Row 1322 contains a calculated difference between row 1321 and row 1320 and represents a set of monthly electrical energy savings which is totaled to an annual electrical energy savings at cell 1323.

Table 1303 further comprises a summary of monetary benefits including an annual monetary savings, a project cost and a project payback time. The annual monetary savings is computed from the annual electrical energy savings, the annual heating fuel savings and the costs of electricity and heating fuel.

Table 1304 further comprises a validation of electrical consumption calibration if the first set of monthly electrical consumptions represents the calibrated baseline energy usage profile for the calibrated baseline configuration. The calibrated annual electrical consumption, reported in cell 1314a, is compared to the actual annual electrical consumption, reported in cell 1315 as derived from the historical energy usage. A percentage difference between the calibrated baseline annual electrical consumption and the actual annual electrical consumption is calculated and reported in cell 1318. If the absolute value of the percentage difference is less than a predefined amount, then a 'PASS' is reported in cell 1319, otherwise a 'FAIL' is reported in cell 1319. Cells 1318 and 1319 implement the first condition of step 876 in FIG. 8. A second annual consumption is reported in cell 1314b for the second set of monthly electrical consumptions. Annual costs for the first and second set of monthly electrical consumptions are given in cells 1316a and 1316b, respectively. Annual costs per unit area for the first and second set of monthly electrical consumptions are given in cells 1317a and 1317b.

Table 1305 further comprises a validation of heating fuel consumption calibration if the first set of monthly heating fuel consumptions represents the calibrated baseline energy usage profile for the calibrated baseline configuration. The calibrated baseline annual heating fuel consumption, reported in cell 1324a, is compared to the actual annual heating fuel consumption, reported in cell 1325 as derived from the historical energy usage. A percentage difference between the calibrated baseline annual heating fuel consumption and the actual annual heating fuel consumption is calculated and reported in cell 1328. If the absolute value of the percentage difference is less than a predefined amount, then a 'PASS' is reported in cell 1329, otherwise a 'FAIL' is reported in cell 1329. Cells 1328 and 1329 implement the second condition of step 878 in FIG. 8. A second annual consumption is reported in cell 1324b for the second set of monthly heating fuel consumptions Annual costs for the first and second set of monthly heating fuel consumptions are given in cells 1326a and 1326b, respectively. Annual costs per unit area for the first and second set of monthly heating fuel consumptions are given in cells 1327a and 1327b.

Figure 14:
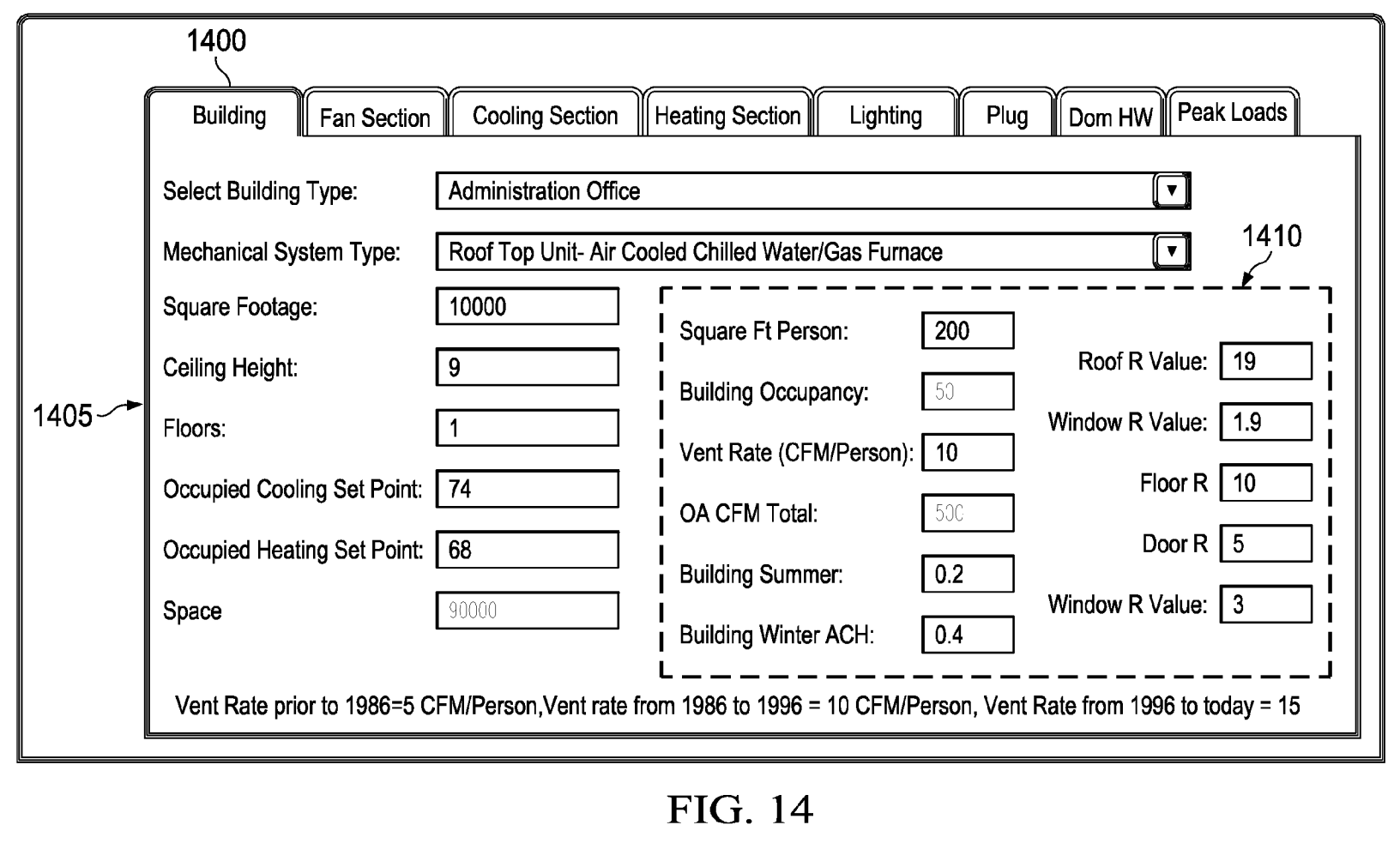

Referring to FIG. 14, building section form 1400 is shown comprising a simplified form area 1405 and an advanced form area 1410. Advanced form area 1410 is selectively hidden. Simplified form area 1405 includes selection controls for building type, mechanical system type, floor area (square footage), ceiling height, number of floors, occupied cooling set point and occupied heating set point. Advanced form area 1410 includes active selection controls for area per person ("Sq. Ft/Person"), vent rate ("CFM/Person"), building summer air changes per hour, building winter air changes per hour, roof R-value, window R-value, floor R-value, door R-value and wall R-value. Advanced form area 1410 also includes reporting areas for calculated and default settings including space volume, building occupancy and outside air ventilation required in CFM.

Figure 15:
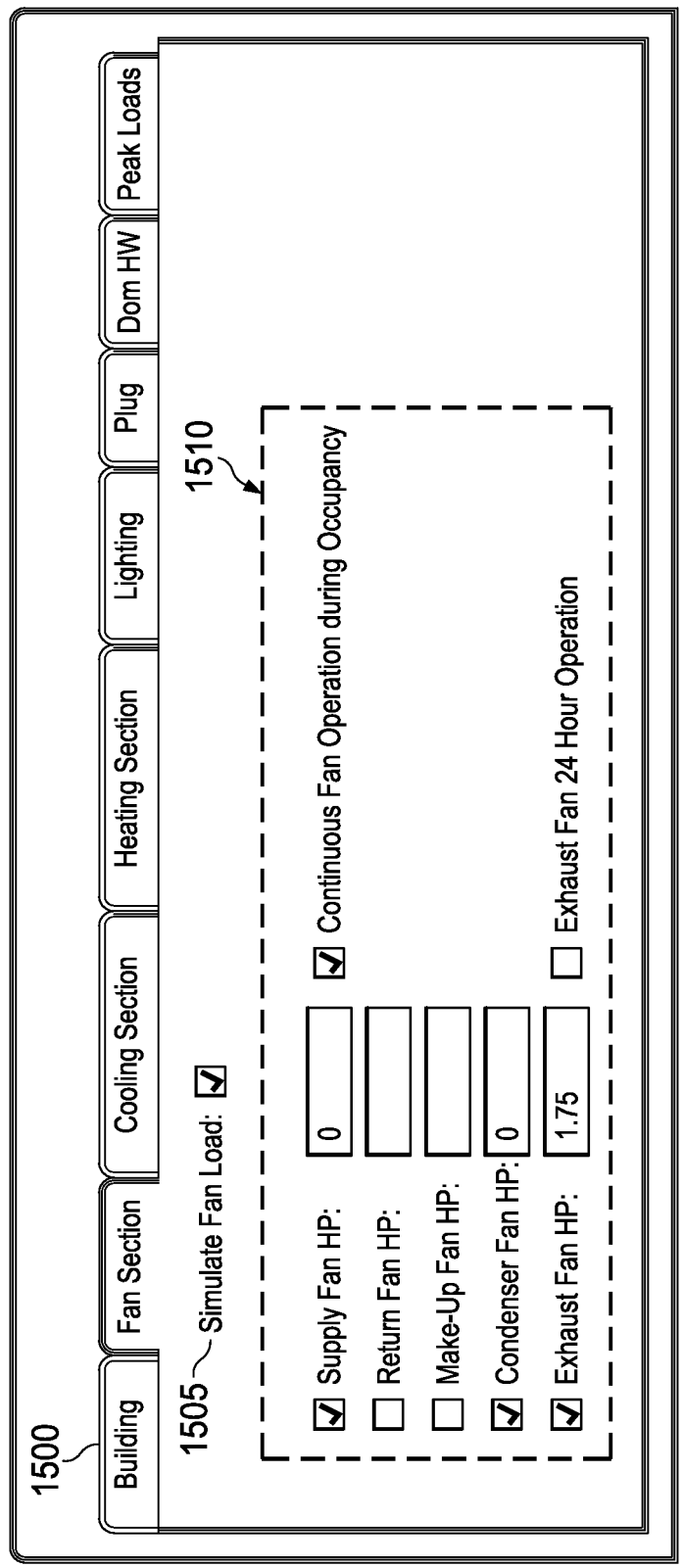
FIG. 15 is a preferred embodiment of an electronic form configured to receive a set of fan parameters for the mechanical systems of a building.

Referring to FIG. 15, fan section form 1500 is shown comprising a simplified form area 1505 and an advanced form area 1510. Advanced form area 1510 is selectively hidden. Simplified form area 1505 includes a selection control for including fan load in the energy simulation. Advanced form area 1510 includes active selection controls supply fan inclusion and horsepower rating, return fan inclusion and horsepower rating, make-up fan inclusion and horsepower rating, condenser fan inclusion and horsepower rating, exhaust fan inclusion and horsepower rating, an inclusion of continuous fan operation during occupancy in the energy simulation and an inclusion of 24 hour exhaust fan operation in the energy simulation.

Figure 16:
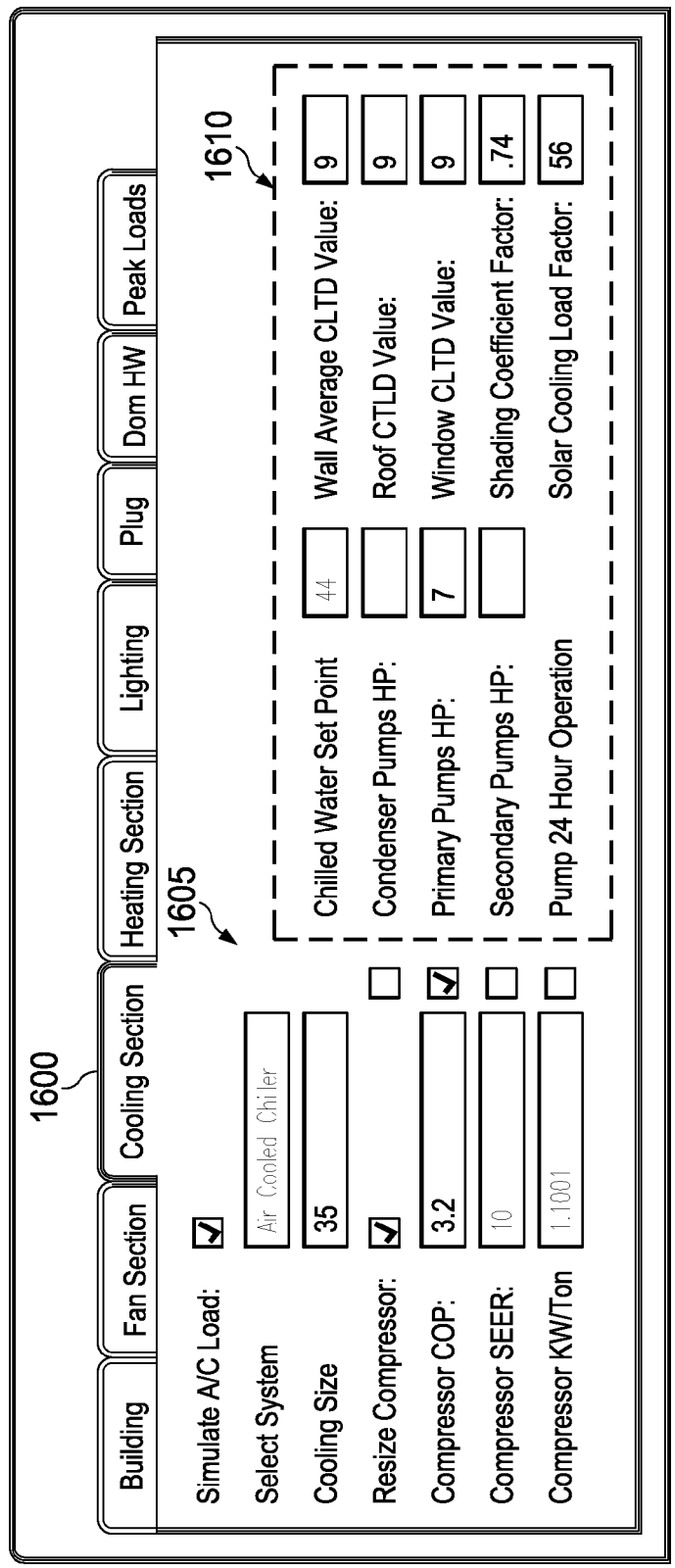
FIG. 16 is a preferred embodiment of an electronic form configured to receive a set of cooling system parameters for a building.

Referring to FIG. 16, cooling section form 1600 is shown comprising a simplified fatal area 1605 and an advanced form area 1610. Advanced form area 1610 is selectively hidden. Simplified form area 1605 includes selection controls for enabling the simulation of cooling system loads, cooling system size, enabling the resizing of the cooling system compressor, compressor COP rating and compressor SEER rating. Simplified form area 1605 also includes reporting areas for calculated and default settings including cooling system selection and kW/ton rating. Advanced form area 1610 includes selection controls for condenser pump inclusion and horsepower rating, primary pump inclusion and horsepower rating, secondary pump inclusion and horsepower rating, enabling 24 hour pump operation, wall average CLTD value, roof CLRD value, window CLTD value, shading coefficient factor and solar cooling load factor. Advanced form area 1610 also includes reporting areas for calculated and default settings including chilled water set point if the cooling system utilizes chilled water.

Figure 17:
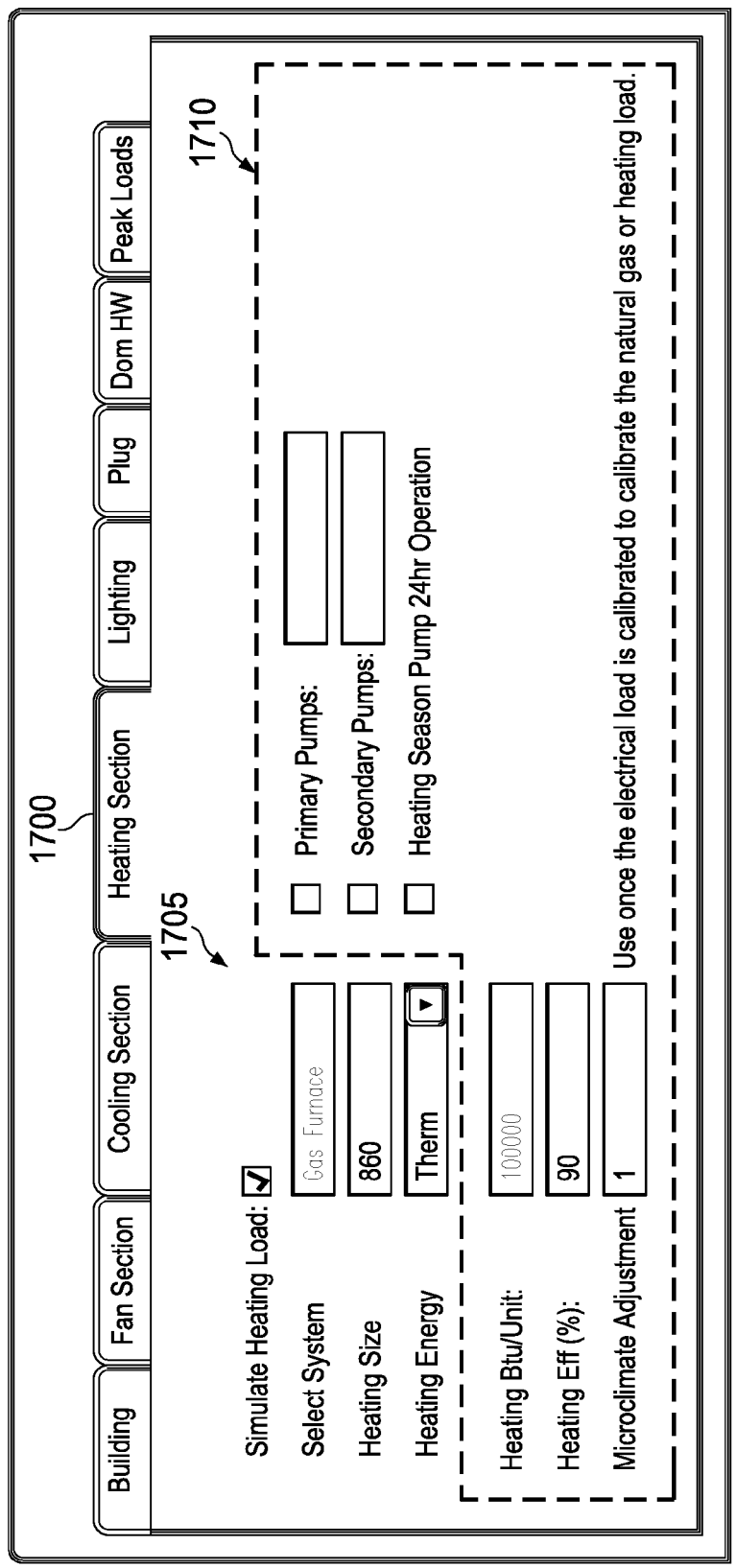
FIG. 17 is a preferred embodiment of an electronic form configured to receive a set of heating system parameters for a building.

Referring to FIG. 17, heating section form 1700 is shown comprising a simplified form area 1705 and an advanced form area 1710. Advanced form area 1710 is selectively hidden. Simplified form area 1705 includes selection controls for enabling the simulation of heating system loads, heating system size, and heating fuel units. Simplified form area 1605 also includes reporting areas for calculated and default settings including heating system selection. Advanced form area 1710 includes selection controls for heating system efficiency, a microclimate adjustment factor, primary pump inclusion and horsepower rating, secondary pump inclusion and horsepower rating and enabling heating system 24 hour operation. Advanced form area 1710 also includes reporting areas for calculated and default settings including heating BTU/heating fuel unit.

Figure 18:
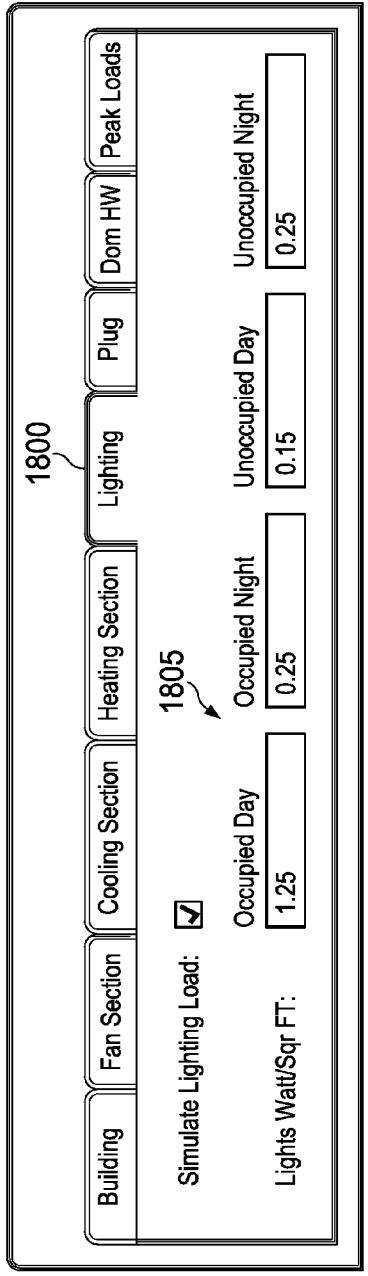
FIG. 18 is a preferred embodiment of an electronic form configured to receive a set of lighting energy usage parameters for a building.

Referring to FIG. 18, lighting section form 1800 is shown comprising a form area 1805 which includes selection controls for enabling the simulation of lighting loads, lighting energy intensity (W/sq. ft.) for occupied daytime, lighting energy intensity for occupied nighttime, lighting energy intensity for unoccupied daytime and lighting energy intensity for unoccupied nighttime.

Figure 19:
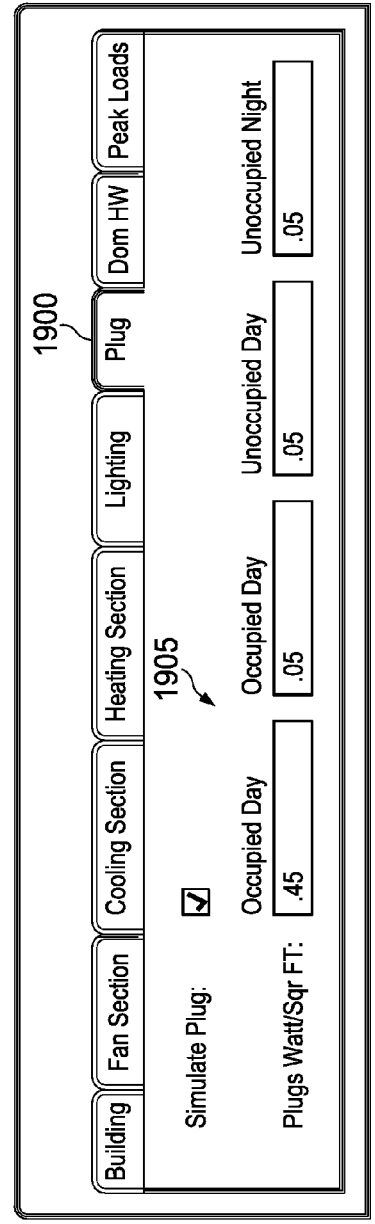
FIG. 19 is a preferred embodiment of an electronic form configured to receive a set of plug load parameters for a building.

Referring to FIG. 19, lighting section form 1900 is shown comprising a form area 1905 which includes selection controls for enabling the simulation of electrical plug loads, energy intensity (W/sq. ft.) for occupied daytime, energy intensity for occupied nighttime, energy intensity for unoccupied daytime and energy intensity for unoccupied nighttime.

Figure 20:
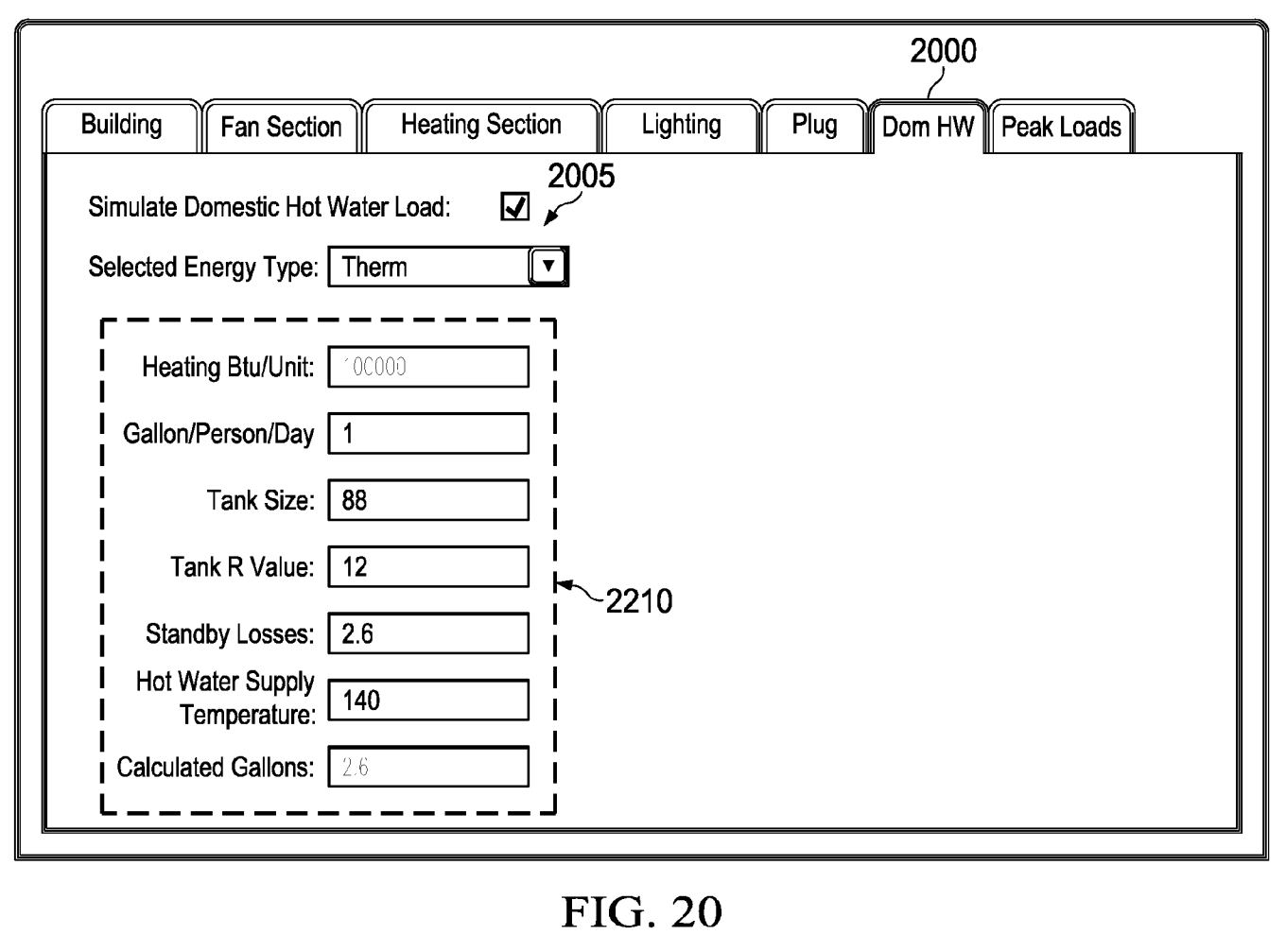

Referring to FIG. 20, domestic water heating section form 2000 is shown comprising a simplified form area 2005 and an advanced form area 2010. Advanced form area 2010 is selectively hidden. Simplified form area 2005 includes selection controls for enabling the simulation of domestic water heating loads and heating fuel units. Simplified form area 2005 also includes reporting areas for calculated and default settings including BTU /heating fuel unit. Advanced form area 2010 includes selection controls for gallons/person/day usage, tank size, tank insulation R-value, standby losses and hot water supply temperature set point. Advanced form area 2010 also includes reporting areas for calculated and default settings including calculated gallons of hot water.

Figure 21:
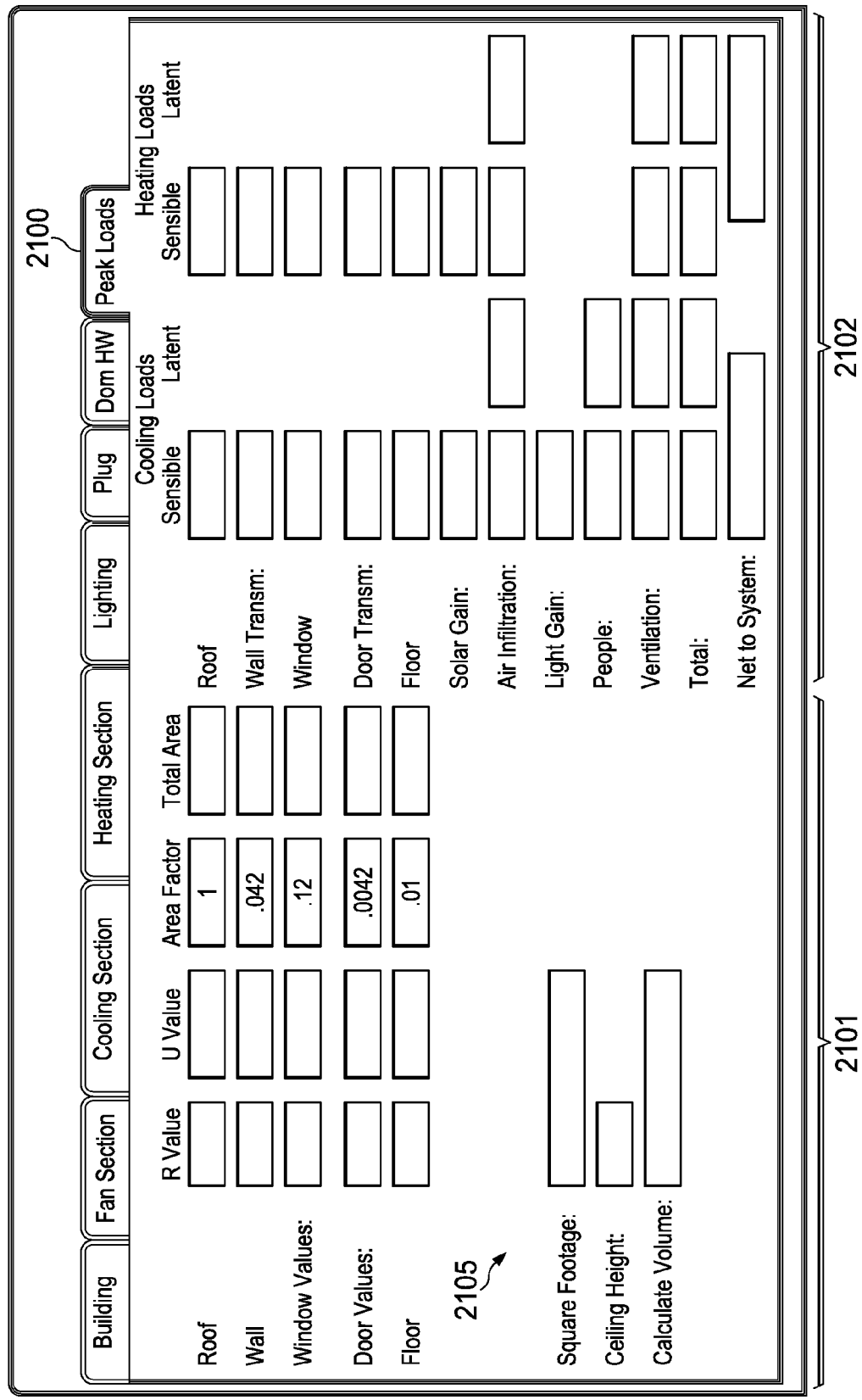
FIG. 21 is a preferred embodiment of an electronic form configured to report and allow modification of a set of peak building load parameters determined for a building.

Referring to FIG. 21, peak loads section form 2100 is shown comprising an advanced form area 2110. Peak loads section form and advanced form area 2110 are selectively hidden. Advanced form area 2110 includes selection controls area 2101 displaying conversion factors including a roof area factor, a wall area factor, a window area factor, a door area factor and a floor area factor. Advanced form area 2110 also includes reporting areas for calculated and copied values including floor area ('Squ Footage'), ceiling height and calculated volume, various building envelope R-values, U-values and building envelope areas. Advanced form area 2110 also has mechanical loads area 2102 including a set of sensible cooling loads, a set of latent cooling loads, a set of sensible heating loads and a set of latent heat loads for the building. In a preferred embodiment, advanced form area 2110 is populated upon execution of step 204 of method 200 and is primarily used as a reporting tool for the load calculations and system sizing.

Referring to FIG. 22, electronic form 2200 for lighting systems simulation is shown. In a preferred embodiment, lighting systems simulation can be performed as a standalone energy simulation which creates lighting energy models for a building. Electronic form 2200 comprises general information area 2205 for receiving building and client information, operational information area 2210 for receiving lighting operational data, fixture information area 2215 for receiving lighting fixture data, selector 2220 for retrieving existing lighting data from a previous lighting energy model and selector 2225 for processing the operational data and the fixture data which stores a lighting energy model based on the lighting operational data and lighting fixture data. Electronic form 2200 further comprises selector 2230 which closes the electronic form and displays the resulting data and selector 2235 which ends the program.

Lighting operational data includes a daily number of operational hours 2211 and a monthly schedule of occupied days 2212. Lighting fixture data includes a set of lighting fixture types 2216 with a description of each lighting fixture type, a quantity of lighting fixtures 2217 for each lighting fixture type and an energy consumption 2218 (wattage) for each lighting fixture type.

Figure 23:
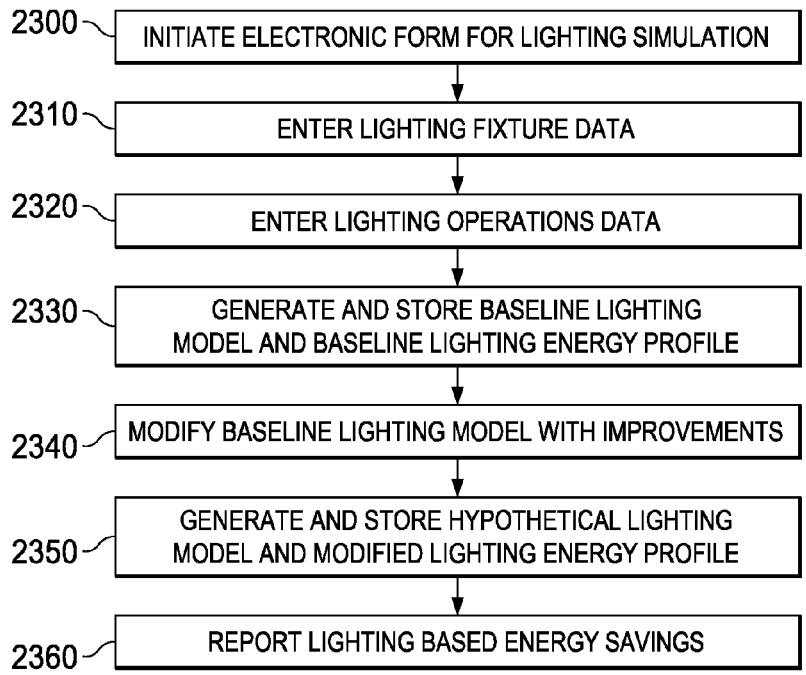
FIG. 23 is a flow chart of a preferred embodiment of a method to create a baseline lighting model and a modified lighting model to determine a lighting based energy savings.

Referring to FIG. 23, a method for lighting systems simulation is described. At step 2300 electronic form 2200 is displayed. At step 2310, the lighting fixture data for a building is entered. At step 2320, the lighting operations data for a building is entered. At step 2330, a baseline lighting energy model is generated and stored resulting in a baseline set of monthly lighting energy consumptions, a baseline operational data and a baseline fixture data. At step 2340, the baseline operational data and baseline fixture data are modified with energy efficiency improvements to arrive at a hypothetical operational data and a hypothetical fixture data. For example, step 2340 can include removing all T12 pin fluorescent light fixture types from the baseline fixture data and adding more efficient T8 pin fluorescent light fixture types in their place to create a modified fixture data.

At step 2350, a hypothetical lighting model is generated and stored resulting in a hypothetical set of monthly lighting energy consumptions based on the hypothetical operational data and the hypothetical fixture data. At step 2360, a set of differences between the set of hypothetical monthly lighting energy consumptions and the set of baseline monthly lighting energy consumptions is calculated and reported along with a total lighting based energy savings. In a preferred embodiment, the set of differences is reported as two energy consumption graphs.

Referring to FIG. 24, electronic form 2400 for accessory equipment simulation is shown. In a preferred embodiment, accessory equipment simulation can be performed as a standalone energy simulation which creates accessory equipment energy models for a building. Electronic form 2400 comprises general information area 2405 for receiving building and client information, operational information area 2410 for receiving equipment operational data, equipment information area 2415 for receiving equipment energy data, selector 2420 for retrieving existing accessory equipment data from a previous accessory equipment energy model and selector 2425 for processing the equipment operational data and the equipment energy data which stores an accessory equipment energy model based on the equipment operational data and equipment energy data. Electronic form 2400 further comprises selector 2430 which closes the electronic form and displays the resulting data and selector 2435 which ends the program.

Equipment operational data includes a daily number of operational hours 2411, a monthly schedule of operational days 2412 and an operational diversity factor 2413. Equipment energy data includes a set of equipment types 2416 with a description of each equipment type, a quantity of equipment 2417 for each equipment type and an energy consumption 2418 (wattage) for each equipment type.

Figure 25:
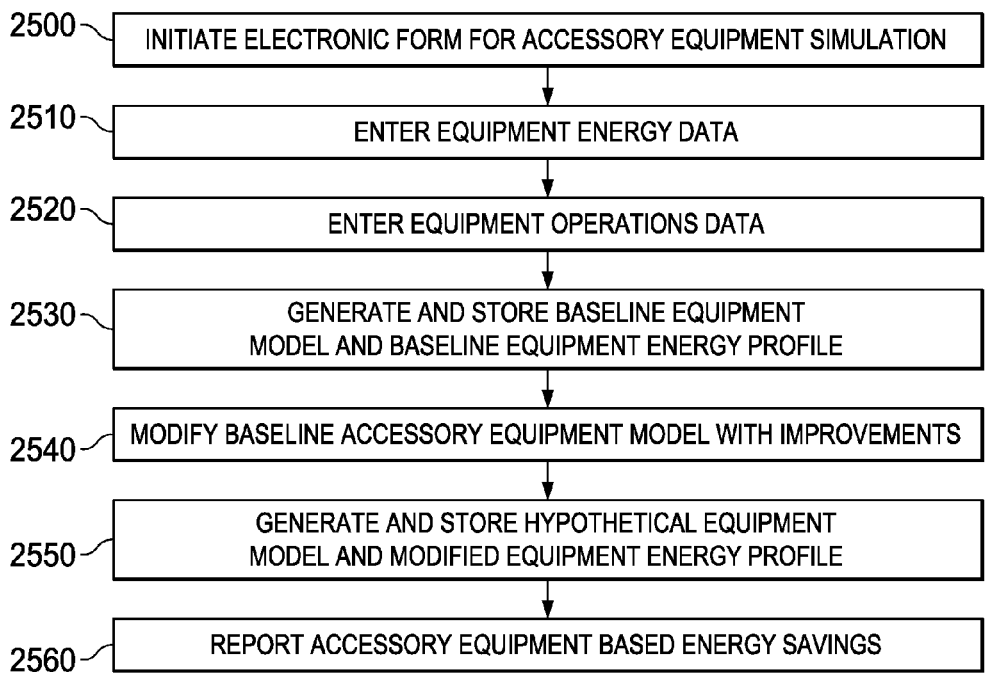
FIG. 25 is a flow chart of a preferred embodiment of a method to create a baseline accessory equipment model and a modified accessory equipment model to determine accessory equipment based energy savings.

Referring to FIG. 25, a method for accessory equipment simulation is described. At step 2500 electronic form 2400 is displayed. At step 2510, a baseline equipment energy data for a building is entered. At step 2520, a baseline equipment operations data for a building is entered. At step 2530, a baseline equipment energy model is generated and stored based on the baseline operational data and the baseline equipment energy data. The baseline energy model includes a baseline set of monthly equipment energy consumptions. At step 2540, the baseline operational data and baseline equipment energy data are modified with energy efficiency improvements to arrive at a hypothetical operational data and a hypothetical equipment energy data. For example, step 2540 can include replacing all exhaust fan motors with more energy efficient exhaust fan motors to create a modified equipment energy data.

At step 2550, a hypothetical equipment energy model is generated and stored resulting in a hypothetical set of monthly equipment energy consumptions, based on the hypothetical operational data and the hypothetical equipment energy data. At step 2560, a set of differences between the set of hypothetical monthly equipment energy consumptions and the set of baseline monthly equipment energy consumptions is calculated and reported along with a total accessory equipment energy savings. In a preferred embodiment, the set of differences is reported as two energy consumption graphs, similar to those of FIG. 9.

While this invention has been described in reference to a preferred embodiment along with other illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:
1. A method for analyzing energy savings for a building comprising:
receiving a set of historical energy usage data for the building;
receiving a set of weather data for the building;
receiving a set of operations parameters for the building;
receiving a set of building physical parameters for the building;
determining a baseline building configuration from the set of operations parameters and the set of building physical parameters;
conducting a first energy consumption simulation of the baseline building configuration to determine a baseline energy usage profile;
determining a calibrated building configuration and a calibrated energy usage profile from the baseline building configuration, the set of historical energy usage data and the baseline energy usage profile;
modifying the calibrated building configuration with a first set of energy improvement measures to determine a hypothetical building configuration;

conducting a second energy consumption simulation of the hypothetical building configuration to determine a hypothetical energy usage profile;

wherein the step of receiving the set of operations parameters further comprises specifying an average occupancy time for an occupied day;

wherein the step of receiving the set of weather data further comprises:
  specifying a weather location;
  determining a set of monthly cooling degree days based on the weather location; and,
  determining a set of monthly heating degree days based on the weather location;

wherein the first energy consumption simulation calculates a cooling load factor for a month (CLF(m)) from the cooling degree days for a month (CDD(m)) and heating degree days for a month (HDD(m)) according to the equation:

$$CLF(m) = \frac{CDD(m)}{CDD(m) + HDD(m)};$$

wherein the first energy consumption simulation calculates a heating load factor for a month (HLF(m)) from the cooling degree days (CDD(m)) and heating degree days (HDD(m)) according to the equations:

$$HLF(m) = \frac{HDD(m)}{CDD(m) + HDD(m)};$$

wherein the step of determining a calibrated building configuration and a calibrated energy usage profile from the baseline building configuration, the historical energy usage and the baseline energy usage profile further comprises:
  determining a first annual energy consumption from the historical energy usage;
  determining a second annual energy consumption from the baseline energy usage profile;
  determining a first percentage difference between the first annual energy consumption and the second annual energy consumption;
  setting the calibrated building configuration equal to the baseline building configuration;
  setting the calibrated energy usage profile equal to the baseline energy usage profile;
  if the absolute value of the first percentage difference is more than a predefined limit value, then:
    adjusting the calibrated building configuration;
    determining a third annual energy consumption;
    calculating a second percentage difference between the first annual energy consumption and the third annual energy consumption;
    iteratively adjusting the calibrated building configuration, iteratively performing the third energy consumption and iteratively calculating the second percentage difference until the absolute value of the second percentage difference is less than or equal to the predefined limit; and,
  if the absolute value of the first percentage difference or the absolute value of the second percentage difference is less than or equal to a predefined limit value, then:
    reporting the calibrated building configuration and the calibrated energy usage profile.

2. The method of claim 1 further comprising:
  determining a second set of improvement measures based on the hypothetical energy usage profile;
  modifying the calibrated building configuration with the second set of energy improvement measures to determine a second hypothetical building configuration; and,
  conducting a third energy consumption simulation of the second hypothetical building configuration to determine a second hypothetical energy usage profile.

3. The method of claim 1 wherein the step of receiving the set of historical energy usage data further comprises:
  specifying a monthly electrical consumption for a year;
  specifying a monthly heating fuel consumption for the year;
  specifying an average electrical cost per unit of electricity;
  specifying a unit of heating fuel; and,
  specifying an average heating fuel cost per the unit of heating fuel.

4. The method of claim 1 wherein the step of receiving the set of operations parameters further comprises:
  specifying a set of monthly occupied days; and,
  specifying an average HVAC operation time for a day.

5. The method of claim 1 wherein the step of receiving the set of building parameters further comprises:
  specifying a set of building envelope parameters;
  specifying a set of fan parameters;
  specifying a set of cooling system parameters;
  specifying a set of heating system parameters;
  specifying a set of lighting parameters;
  specifying a set of plug load parameters; and,
  specifying a set of domestic hot water heater parameters.

6. The method of claim 5 wherein the step of receiving the set of building parameters further comprises:
  determining a set of peak load parameters.

7. The method of claim 5 wherein the step of specifying the set of building envelope parameters further comprises:
  selecting a building type;
  selecting a mechanical system type;
  specifying a floor area;
  specifying a ceiling height;
  specifying an occupied cooling temperature set point; and,
  specifying an occupied heating temperature set point.

8. The method of claim 7:
  wherein the building type is selected from a set of predefined building types wherein selecting a building type automatically loads an associated set of building physical parameters;
  wherein the associated set of building physical parameters includes: a ventilation cubic feet per minute (CFM) per person, a window R value, a door R value, a floor R value, a wall R value, a roof R value, a wall height, and an occupied area per person;
  wherein the R-values are converted into U values to calculate heating and cooling loads, where U=1/R, resulting in $U_{wall}$, $U_{roof}$, $U_{floor}$, $U_{window}$ and $U_{door}$;
  wherein a classroom building type has an associated set of parameters: ventilation CFM=15, window R value=1.9, door R value=5, floor R value=10, wall R value=3, roof R value=19, wall height=9 ft. and occupied area per person=110 sq. ft. with $U_{wall}$=0.33, $U_{roof}$=0.052, $U_{floor}$=0.10, $U_{window}$=0.52, and $U_{door}$=0.20; and,
  wherein a gymnasium building type has an associated set of parameters: ventilation CFM=5, window R value=1.9, door R value=5, floor R value=10, wall R value=3, roof R value=19, wall height=25 ft. and occupied area per person=90 sq. ft. with $U_{wall}$=0.33, $U_{roof}$=0.052, $U_{floor}$=0.10, $U_{window}$=0.52, and $U_{door}$=0.20.

9. The method of claim 5 wherein the step of specifying the set of fan parameters further comprises:
   specifying a set of fan loads.

10. The method of claim 9 wherein the step of specifying the set of fan loads further comprises:
    selecting at least one fan type on a set of fan types;
    specifying a motor power for the at least one fan type; and,
    specifying whether a set of fans operate continuously.

11. The method of claim 5 wherein the step of specifying the set of cooling system parameters further comprises:
    specifying the set of cooling system parameters based on the set of building envelope parameters;
    performing a system sizing calculation to determine a cooling system size;
    specifying whether to simulate an air conditioning load;
    adjusting the cooling system size; and,
    specifying a cooling system efficiency.

12. The method of claim 5 wherein the step of specifying the set of heating system parameters further comprises:
    specifying the set of heating system parameters based on the set of building envelope parameters;
    performing a system sizing calculation to determine a heating system size;
    determining whether to simulate a set of heating loads;
    adjusting the heating system size; and,
    specifying a heating system efficiency.

13. The method of claim 5 wherein the step of specifying the set of lighting parameters further comprises:
    specifying whether to simulate a lighting load from the set of lighting parameters;
    specifying a first light load intensity for an occupied day;
    specifying a second light load intensity for an occupied night;
    specifying a third light load intensity for an unoccupied day; and,
    specifying a fourth light load intensity for an unoccupied night.

14. The method of claim 5 wherein the step of specifying the set of plug loads further comprises:
    specifying whether to simulate a plug load from the set of plug loads;
    specifying a first plug load intensity for an occupied day;
    specifying a second plug load intensity for an occupied night;
    specifying a third plug load intensity for an unoccupied day; and,
    specifying a fourth plug load intensity for an unoccupied night.

15. The method of claim 5 wherein the step of specifying a set of domestic hot water heater parameters further comprises:
    determining whether or not to simulate a domestic hot water heating load; and,
    selecting a domestic hot water heating fuel.

16. The method of claim 1 further comprising:
    simulating an electrical energy consumption for a set of lighting systems.

17. The method of claim 1 further comprising:
    simulating an electrical energy consumption for a set of plug loads.

18. The method of claim 1 further comprising:
    simulating a heating fuel energy consumption for a set of heating systems.

19. The method of claim 1 further comprising:
    simulating an electrical energy consumption for a set of cooling systems.

20. The method of claim 1 further comprising:
    simulating an energy consumption for a set of hot water heating systems.

21. The method of claim 1 further comprising:
    simulating an electrical energy consumption for a set of fans.

22. The method of claim 1 further comprising:
    simulating an electrical energy consumption for a set of pump motors.

23. The method of claim 1 wherein the step of determining a calibrated building configuration and a calibrated energy usage profile from the baseline building configuration, the historical energy usage and the baseline energy usage profile further comprises:
    determining an actual monthly energy consumption from the set of historical energy usage data;
    determining a baseline monthly energy consumption from the baseline energy usage profile;
    performing a first comparison between the actual monthly energy consumption and the baseline monthly energy consumption;
    setting the calibrated building configuration equal to the baseline building configuration;
    setting the calibrated energy usage profile equal to the baseline energy usage profile;
    if the first comparison does not meet a calibration condition, then:
      adjusting the calibrated building configuration;
      performing a third energy consumption simulation based on the calibrated building configuration to determine the calibrated energy usage profile including a calibrated monthly energy consumption;
      performing a second comparison between the actual monthly energy consumption and the calibrated monthly energy consumption;
      iteratively adjusting the calibrated building configuration;
      iteratively performing the third energy consumption simulation and iteratively performing the second comparison until the second comparison meets a calibration condition; and,
    if the first comparison or the second comparison meets the calibration condition, then reporting the calibrated building configuration and the calibrated energy usage profile.

24. The method of claim 23, wherein the step of performing a second comparison further comprises:
    plotting the actual monthly energy consumption and a third monthly energy consumption; and,
    performing a graphical comparison between the actual monthly energy consumption and the third monthly energy consumption.

25. The method of claim 23, wherein the step of performing a second comparison further comprises:
    determining a correlation coefficient related to curve shape.

26. The method of claim 23, wherein the step of performing a second comparison further comprises:
    determining a correlation coefficient related to closeness between data points.

27. The method of claim 23, further comprising:
    determining a first correlation coefficient related to curve shape between the actual monthly energy consumption and the calibrated monthly energy consumption;

determining a second correlation coefficient related to closeness between data points between the actual monthly energy consumption and the calibrated monthly energy consumption; and, evaluating the second comparison as a numerical combination of the first correlation coefficient and the second correlation coefficient.

28. The method of claim 27:

wherein the first correlation coefficient is a Pearson correlation coefficient;

wherein the second correlation coefficient is a root mean square (RMS) correlation coefficient; and, wherein the numerical combination is an average of a difference between the Pearson correlation coefficient and a first predefined number and the difference between the RMS correlation coefficient and a second predefined number.

29. The method of claim 1 further comprising:

reporting the calibrated building configuration and the calibrated energy usage profile in graphical and tabular form.

30. A system for analyzing energy savings of a building comprising:

a computer having a processor, a memory and a set of program instructions resident in the memory that when executed by the processor perform the steps comprising:

receiving a set of historical energy usage data for the building;

receiving a set of weather data for the building;

receiving a set of operations parameters for the building;

receiving a set of building physical parameters for the building;

determining a baseline building configuration from the set of operations parameters and the set of building physical parameters;

conducting a first energy consumption simulation of the baseline building configuration to determine a baseline energy usage profile;

determining a calibrated building configuration and a calibrated energy usage profile from the baseline building configuration, the historical energy usage and the baseline energy usage profile;

modifying the calibrated building configuration with a first set of energy improvement measures to determine a hypothetical building configuration;

conducting a second energy consumption simulation of the hypothetical building configuration to a second energy consumption simulation to determine a hypothetical energy usage profile;

wherein the step of receiving the set of operations parameters further comprises specifying an average occupancy time for an occupied day;

wherein the step of receiving the set of weather data further comprises:

specifying a weather location;

determining a set of monthly cooling degree days based on the weather location; and, determining a set of monthly heating degree days based on the weather location;

wherein the first energy consumption simulation calculates a cooling load factor for a month (CLF(m)) from the cooling degree days for a month (CDD(m)) and heating degree days for a month (HDD(m)) according to the equation:

$$CLF(m) = \frac{CDD(m)}{CDD(m) + HDD(m)};$$

wherein the first energy consumption simulation calculates a heating load factor for a month (HLF(m)) from the cooling degree days (CDD(m)) and heating degree days (HDD(m)) according to the equations:

$$HLF(m) = \frac{HDD(m)}{CDD(m) + HDD(m)};$$

wherein the step of determining a calibrated building configuration and a calibrated energy usage profile from the baseline building configuration, the historical energy usage and the baseline energy usage profile further comprises:

determining a first annual energy consumption from the historical energy usage;

determining a second annual energy consumption from the baseline energy usage profile;

determining a first percentage difference between the first annual energy consumption and the second annual energy consumption;

setting the calibrated building configuration equal to the baseline building configuration;

setting the calibrated energy usage profile equal to the baseline energy usage profile;

if the absolute value of the first percentage difference is more than a predefined limit value, then:

adjusting the calibrated building configuration;

determining a third annual energy consumption;

calculating a second percentage difference between the first annual energy consumption and the third annual energy consumption;

iteratively adjusting the calibrated building configuration, iteratively performing the third energy consumption and iteratively calculating the second percentage difference until the absolute value of the second percentage difference is less than or equal to the predefined limit; and, if the absolute value of the first percentage difference or the absolute value of the second percentage difference is less than or equal to a predefined limit value, then:

reporting the calibrated building configuration and the calibrated energy usage profile.

31. The system of claim 30 wherein the set of program instructions further comprises instructions that when executed by the processor perform the steps of:

determining a first annual energy consumption from the historical energy usage;

determining a second annual energy consumption from the baseline energy usage profile;

determining a first percentage difference between the first annual energy consumption and the second annual energy consumption;

setting the calibrated building configuration equal to the baseline building configuration;

setting the calibrated energy usage profile equal to the baseline energy usage profile;

if the absolute value of the first percentage difference is more than a predefined limit value, then:

adjusting the calibrated building configuration;

determining a third annual energy consumption;

calculating a second percentage difference between the first annual energy consumption and the third annual energy consumption;

iteratively adjusting the calibrated building configuration, iteratively performing the third energy consumption and iteratively calculating the second percentage difference until the absolute value of the second percentage difference is less than or equal to the predefined limit; and, if the absolute value of the first percentage difference or the absolute value of the second percentage difference is less than or equal to a predefined limit value, then reporting the calibrated building configuration and the calibrated energy usage profile.

32. The system of claim 30 wherein the set of program instructions further comprises instructions that when executed by the processor perform the steps of:

determining an actual monthly energy consumption from the historical energy usage;

determining a baseline monthly energy consumption from the baseline energy usage profile;

performing a first comparison between the actual monthly energy consumption and the baseline monthly energy consumption;

setting the calibrated building configuration equal to the baseline building configuration;

setting the calibrated energy usage profile equal to the baseline energy usage profile;

if the first comparison does not meet a calibration condition, then:

adjusting the calibrated building configuration;

determining a calibrated monthly energy consumption;

performing a second comparison between the actual monthly energy consumption and the calibrated monthly energy consumption;

iteratively adjusting the calibrated building configuration, iteratively performing a third energy consumption simulation and iteratively performing the second comparison until the second comparison meets a calibration condition; and, if the first comparison or the second comparison meets the calibration condition, then reporting the calibrated building configuration and the calibrated energy usage profile.

33. The system of claim 32 wherein the set of program instructions further comprises instructions that when executed by the processor perform the steps of:

plotting the actual monthly energy consumption and a third monthly energy consumption; and, performing a graphical comparison between the actual monthly energy consumption and the third monthly energy consumption to determine the second comparison.

34. The system of claim 32 wherein the steps of performing a second comparison further comprises:

determining a correlation coefficient related to curve shape.

35. The system of claim 32 wherein the steps of performing a second comparison further comprises:

determining a correlation coefficient related to closeness between data points.

36. The system of claim 32 wherein the set of program instructions further comprises instructions that when executed by the processor perform the steps of:

determining a first correlation coefficient related to a curve shape between the actual monthly energy consumption and the calibrated monthly energy consumption;

determining a second correlation coefficient related to a closeness between data points between the actual monthly energy consumption and the calibrated monthly energy consumption; and, evaluating the second comparison as a numerical combination of the first correlation coefficient and the second correlation coefficient.

37. The system of claim 30 wherein the set of program instructions further comprises instructions that when executed by the processor perform the steps of:

displaying an electronic form for the historical energy usage;

specifying in the electronic form, a monthly electrical consumption for a year;

specifying in the electronic form, a monthly heating fuel consumption for the year;

specifying in the electronic form an average electrical cost per unit of electricity;

specifying in the electronic form a unit of heating fuel;

specifying in the electronic form an average heating fuel cost per the unit of heating fuel; and, storing the monthly electrical consumption, the monthly heating fuel consumption, the average electrical cost, the unit of heating fuel and the average heating fuel cost in the memory.

38. The system of claim 30 wherein the set of program instructions further comprises instructions that when executed by the processor perform the steps of:

displaying an electronic form for the weather data;

specifying a weather location in the electronic form;

determining a set of monthly cooling degree days based on the weather location;

displaying the set of monthly cooling degree days in the first electronic form;

determining a set of monthly heating degree days based on the weather location; and, displaying the set of monthly heating degree days in the electronic form.

39. The system of claim 30 wherein the set of program instructions further comprises instructions that when executed by the processor perform the steps of:

displaying an electronic form for the set of operations parameters;

specifying a set of monthly occupied days in the electronic form;

specifying an average occupancy time for an occupied day in the electronic form;

specifying an average HVAC operation time for a day in the electronic form; and, storing the set of operations parameters.

40. The system of claim 30 wherein the set of program instructions further comprises instructions that when executed by the processor perform the steps of:

accessing a first electronic form, a second electronic form, a third electronic form, a fourth electronic form, a fifth electronic form, a sixth electronic form and a seventh electronic form from a main electronic form;

specifying in the first electronic form a set of building envelope parameters;

specifying in the second electronic form a set of fan parameters;

specifying in the third electronic form a set of cooling system parameter;

specifying in the fourth electronic form a set of heating system parameters;

specifying in the fifth electronic form a set of lighting parameters; and specifying in the sixth electronic form a set of plug load parameters.

41. The system of claim 40:

wherein the main electronic form is a window of a graphical user interface; and, wherein each of the first electronic form, the second electronic form, the third electronic form, the fourth electronic form, the fifth electronic form, the sixth electronic form and the seventh electronic form are accessed by selecting one of a plurality of tabs displayed on the main electronic foam.

\* \* \* \* \*